United States Patent
Obana et al.

(10) Patent No.: US 8,086,888 B2
(45) Date of Patent: Dec. 27, 2011

(54) STORAGE MANAGEMENT SERVER AND STORAGE CONFIGURATION RELOCATING METHOD

(75) Inventors: Manabu Obana, Kawasaki (JP); Yoshihito Takayama, Yokohama (JP)

(73) Assignee: Hitachi, Ltd., Tokyo (JP)

( * ) Notice: Subject to any disclaimer, the term of this patent is extended or adjusted under 35 U.S.C. 154(b) by 510 days.

(21) Appl. No.: 12/364,015

(22) Filed: Feb. 2, 2009

(65) Prior Publication Data

US 2010/0138682 A1 Jun. 3, 2010

(30) Foreign Application Priority Data

Nov. 28, 2008 (JP) ................................ 2008-305598

(51) Int. Cl.
 *G06F 1/00* (2006.01)
(52) U.S. Cl. ............ 713/340; 713/300; 710/18; 702/57; 702/58; 711/114
(58) Field of Classification Search .................. 713/300, 713/310, 320, 330, 340; 710/18; 702/57, 702/58; 714/6.13, 54; 711/114
See application file for complete search history.

(56) References Cited

U.S. PATENT DOCUMENTS

| | | | |
|---|---|---|---|
| 5,423,046 A | 6/1995 | Nunnelley et al. | |
| 5,732,215 A | 3/1998 | Boutaghou et al. | |
| 5,751,575 A * | 5/1998 | Hirosawa et al. | ............... 700/83 |
| 5,828,583 A * | 10/1998 | Bush et al. | ..................... 702/185 |
| 6,714,977 B1 * | 3/2004 | Fowler et al. | ................. 709/224 |
| 6,968,470 B2 * | 11/2005 | Larson et al. | ................ 713/340 |
| 7,139,170 B2 * | 11/2006 | Chikusa et al. | ............... 361/695 |
| 7,227,713 B2 * | 6/2007 | Yamamoto et al. | ............. 360/69 |
| 7,295,935 B2 * | 11/2007 | Kasprzak et al. | ............... 702/63 |
| 7,373,559 B2 * | 5/2008 | Guha | ............................... 714/54 |
| 7,444,483 B2 * | 10/2008 | Taguchi et al. | ............... 711/156 |
| 7,463,999 B2 * | 12/2008 | Li | ............................... 702/182 |
| 7,536,576 B2 | 5/2009 | Shima et al. | |
| 7,543,108 B2 * | 6/2009 | Kakihara et al. | .............. 711/112 |
| 7,590,473 B2 * | 9/2009 | Wyatt | ............................. 700/299 |
| 7,698,580 B2 * | 4/2010 | Schindler et al. | ............. 713/300 |
| 7,908,505 B2 * | 3/2011 | Malik et al. | .................... 713/340 |
| 7,971,093 B1 * | 6/2011 | Goel et al. | .................... 714/6.13 |
| 7,983,125 B2 * | 7/2011 | El-Batal et al. | .............. 369/47.5 |
| 2007/0294552 A1 * | 12/2007 | Kakihara et al. | .............. 713/320 |
| 2008/0091898 A1 | 4/2008 | Takahashi et al. | |
| 2009/0271645 A1 * | 10/2009 | Mori | ............................. 713/320 |
| 2009/0316541 A1 * | 12/2009 | Takada et al. | ................ 369/47.5 |

FOREIGN PATENT DOCUMENTS

JP    10283767    10/1998

(Continued)

OTHER PUBLICATIONS

Fujitsu Technology Solutions. PRIMERGY ServerView Suite RAID Management. User Manual. Edition 5.3. 2011.*

(Continued)

*Primary Examiner* — Matthew Spittle
(74) *Attorney, Agent, or Firm* — Brundidge & Stanger, P.C.

(57) ABSTRACT

A storage management server collects, stores and displays positions, temperatures and temperature threshold values of physical storage devices from a storage apparatus. It collects, stores and displays positions and power consumptions of variable factor generation sources which are factors that cause the physical storage devices to vary in operation environments, and also calculates the influenceability by variable factor generation sources against the physical storage devices and affected temperatures thereof. It compares the temperature of a given physical storage device to a temperature threshold value of this physical storage device or compares it to an affected temperature thereof due to the variable factor generation sources, thereby moving, for data transfer, an operation position of physical storage device based on a comparison result at such time.

5 Claims, 25 Drawing Sheets

FOREIGN PATENT DOCUMENTS

| | | |
|---|---|---|
| JP | 2006-99748 | 4/2006 |
| JP | 2007272653 | 10/2007 |
| WO | 2006060670 | 6/2006 |

OTHER PUBLICATIONS

Hewlett Packard. HP P9000 Disk Array Family—Model P9500 and HP P9000 Software. QuickSpecs. Version 7. Jun. 9, 2011.*

EMC. EMC CLARiiON Virtual Provisioning. Applied Technology. White Paper. Aug. 2010.*

Partial English language translation of Japanese Office Action, dated Nov. 19, 2010, issued in counterpart Japanese Patent Application No. 2008-305598.

Alex Karabuto, HDD Diet: Power Consumption and Heat Dissipation, Jul. 11, 2005, XP002581327, pp. 1-15.

\* cited by examiner

FIG. 3
(a) PHYSICAL STORAGE DEVICE GROUP-A
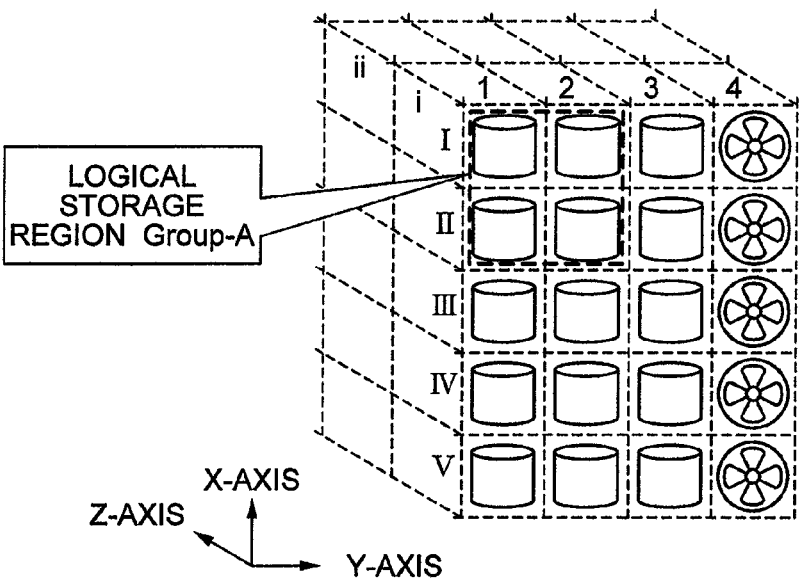
(b) PHYSICAL STORAGE DEVICE GROUP-B
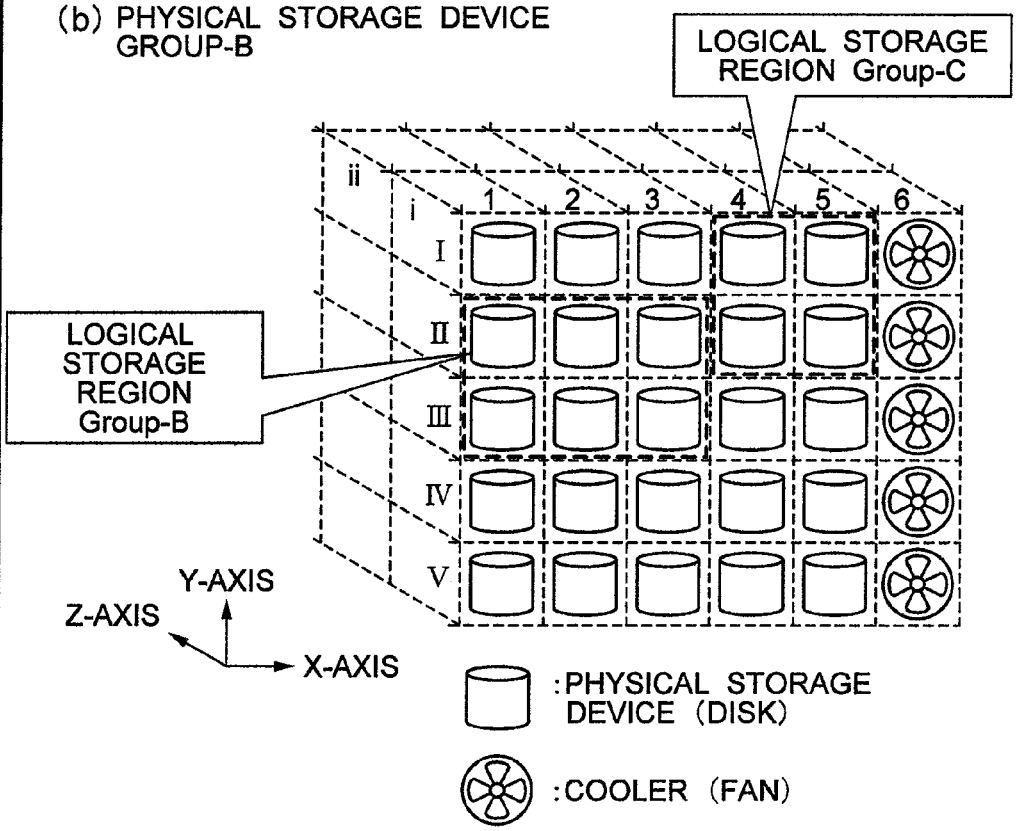

FIG. 4

3108 PHYSICAL STORAGE DEVICE MANAGEMENT INFO

| PHYSICAL STORAGE DEVICE MANAGEMENT ID | POSITION INFO ||| OPERATION STATE | ATTRIBUTE INFO ||||| 
| | DEVICE GROUP ID | X-AXIS | Y-AXIS | Z-AXIS | | LOGICAL STORAGE REGION INFO | OPERATION ENVIRONMENT INFO ||||
| | | | | | | | OPERATION ENVIRONMENT THRESHOLD VALUE | OPERATION ENVIRONMENT VALUE | OPERATION ENVIRONMENT INFLUENCE VALUE | AFFECTED OPERATION ENVIRONMENT VALUE |
|---|---|---|---|---|---|---|---|---|---|---|
| Disk—A1 Ⅰi | A | 1 | Ⅰ | i | OPERATING | Group—A | 40.0°C | 31.7°C | 0.0°C | 31.7°C |
| Disk—A2 Ⅰi | A | 2 | Ⅰ | i | OPERATING | Group—A | 40.0°C | 31.2°C | 0.0°C | 31.2°C |
| Disk—A3 Ⅰi | A | 3 | Ⅰ | i | STOP | — | 40.0°C | 20.6°C | 0.0°C | 20.6°C |
| Disk—A1 Ⅱi | A | 1 | Ⅱ | i | STOP | — | 40.0°C | 20.0°C | 0.0°C | 20.0°C |
| … | | | | | | | … | | | |
| Disk—B1 Ⅱi | B | 1 | Ⅱ | i | OPERATING | Group—B | 40.0°C | 39.0°C | −13.6°C | 25.4°C |
| Disk—B2 Ⅱi | B | 2 | Ⅱ | i | OPERATING | Group—B | 40.0°C | 40.9°C | −15.0°C | 25.9°C |
| Disk—B3 Ⅱi | B | 3 | Ⅱ | i | OPERATING | Group—B | 40.0°C | 40.9°C | −13.6°C | 27.3°C |
| Disk—B4 Ⅱi | B | 4 | Ⅱ | i | OPERATING | Group—B | 40.0°C | 39.5°C | −4.2°C | 35.3°C |
| Disk—B5 Ⅱi | B | 5 | Ⅱ | i | OPERATING | Group—B | 40.0°C | 34.6°C | −2.1°C | 32.5°C |
| Disk—B1 Ⅲi | B | 1 | Ⅲ | i | RESERVED | Group—B | 40.0°C | 25.0°C | +12.3°C | 37.3°C |
| Disk—B2 Ⅲi | B | 2 | Ⅲ | i | RESERVED | Group—B | 40.0°C | 25.0°C | +14.2°C | 39.2°C |
| Disk—B3 Ⅲi | B | 3 | Ⅲ | i | RESERVED | Group—B | 40.0°C | 25.0°C | +12.3°C | 37.3°C |
| Disk—B4 Ⅲi | B | 4 | Ⅲ | i | STOP | — | 40.0°C | 25.0°C | +2.0°C | 27.0°C |
| … | | | | | | | … | | | |

FIG. 5

3109 VARIABLE FACTOR GENERATION SOURCE MANAGEMENT INFO

| VARIABLE FACTOR GENERATION SOURCE MANAGEMENT ID | ATTRIBUTE INFO 502 | | | | | 503 | 504 | 505 |
|---|---|---|---|---|---|---|---|---|
| | DEVICE GROUP ID | POSITION INFO | | | | GENERATION SOURCE TYPE | OPERATION STATE | GENERATION VALUE |
| | | X-AXIS | Y-AXIS | Z-AXIS | | | | |
| Disk-A1 Ii | A | 1 | I | ⋮ | | Disk | OPERATING | +12.0W |
| Disk-A2 Ii | A | 2 | I | ⋮ | | Disk | OPERATING | +12.0W |
| Disk-A3 Ii | A | 3 | I | ⋮ | | Disk | STOP | +12.0W |
| Disk-A4 Ii | A | 4 | I | ⋮ | | Fan | OPERATING | −15.0W |
| ⋮ | | | | | | | | |
| Disk-B1 II | B | 1 | II | ⋮ | | Disk | OPERATING | +10.0W |
| Disk-B2 II | B | 2 | II | ⋮ | | Disk | OPERATING | +10.0W |
| Disk-B3 II | B | 3 | II | ⋮ | | Disk | OPERATING | +10.0W |
| Disk-B4 II | B | 4 | II | ⋮ | | Disk | OPERATING | +10.0W |
| Disk-B5 II | B | 5 | II | ⋮ | | Disk | OPERATING | +10.0W |
| Fan-B6 II | B | 6 | II | ⋮ | | Fan | OPERATING | −20.0W |
| Disk-B1 III | B | 1 | III | ⋮ | | Disk | RESERVED | +10.0W |
| Disk-B2 III | B | 2 | III | ⋮ | | Disk | RESERVED | +10.0W |
| Disk-B3 III | B | 3 | III | ⋮ | | Disk | RESERVED | +10.0W |
| Disk-B4 III | B | 4 | III | ⋮ | | Disk | STOP | +10.0W |
| ⋮ | | | | | | ⋮ 511 | | |

501

FIG. 13
(a) IMAGE WITH ONLY X-AXIS VALUE DESIGNATED
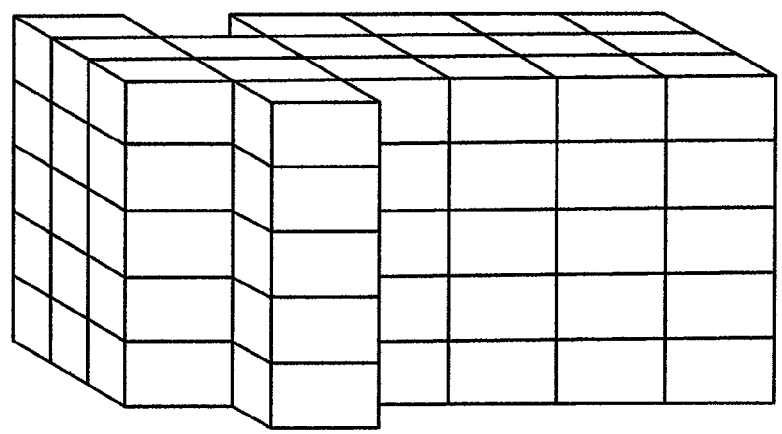
(b) IMAGE WITH ONLY Y-AXIS VALUE DESIGNATED
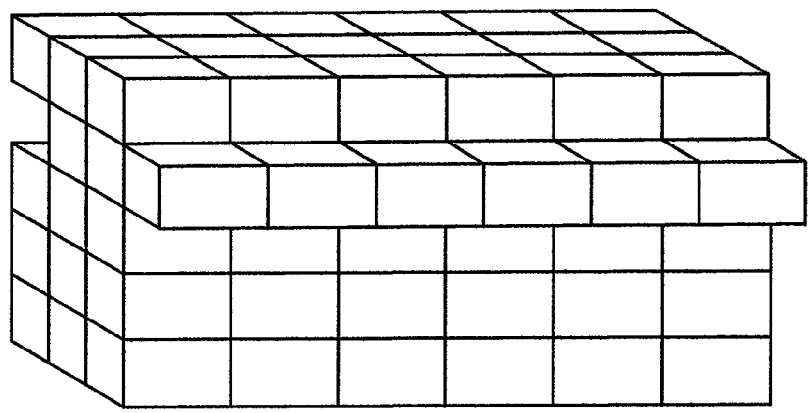

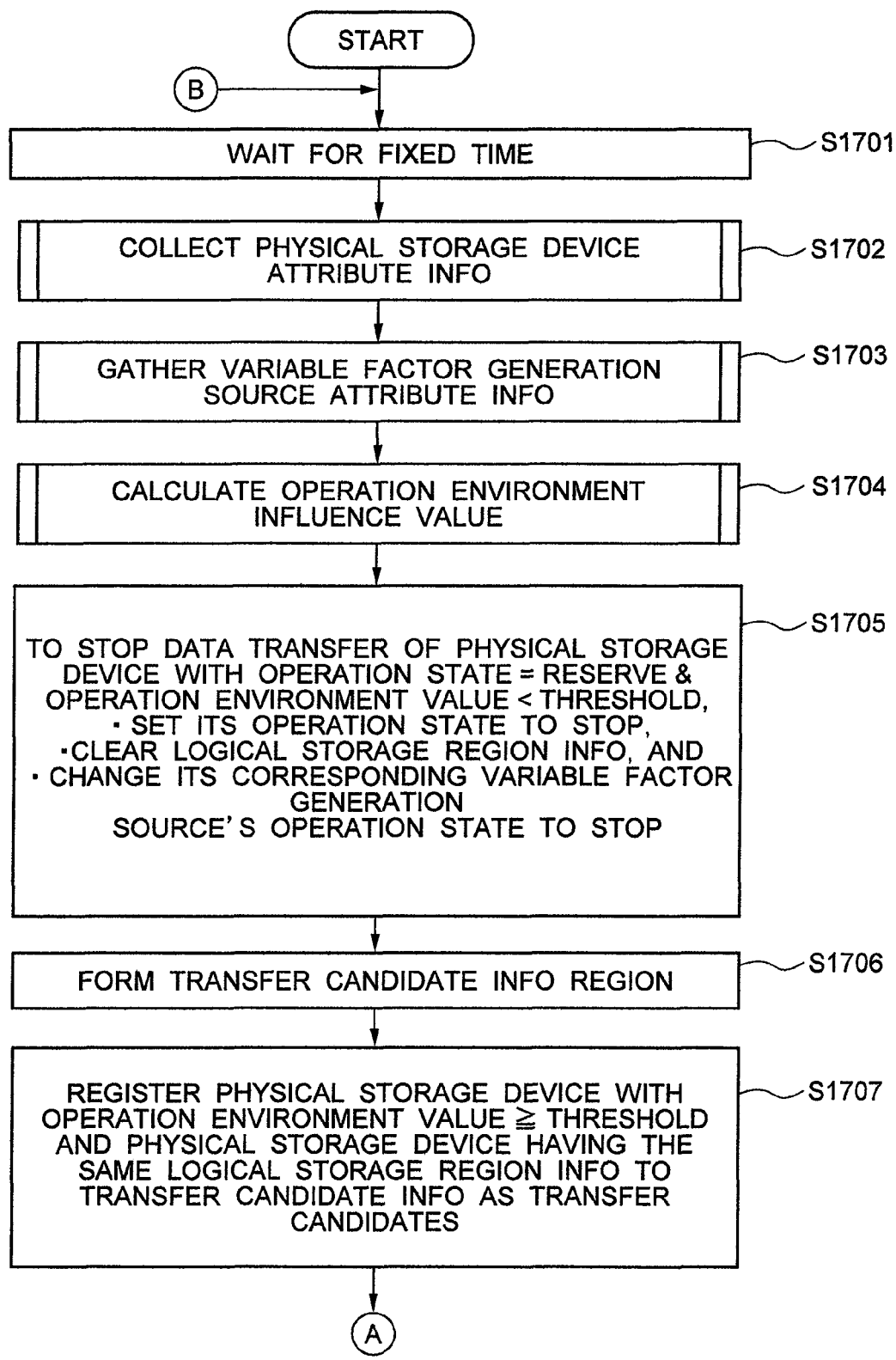

FIG. 18

3110 TRANSFER CANDIDATE INFORMATION

| TRANSFER CANDIDATE PHYSICAL STORAGE DEVICE MANAGEMENT ID | ATTRIBUTE INFO ||||| TRANSFER DESTINATION PHYSICAL STORAGE DEVICE MANAGEMENT ID |
| --- | --- | --- | --- | --- | --- | --- |
| | POSITION INFO |||  LOGICAL STORAGE REGION INFO | OPERATION ENVIRONMENT INFO || |
| | DEVICE GROUP | X-AXIS | Y-AXIS | Z-AXIS | | THRESHOLD | OPERATION ENVIRONMENT VALUE | |
| Disk–B1 IIi | B | 1 | II | i | Group–B | 40.0°C | 39.0°C | Disk–B1 IIIi |
| Disk–B2 IIi | B | 2 | II | i | Group–B | 40.0°C | 40.9°C | Disk–B2 IIIi |
| Disk–B3 IIi | B | 3 | II | i | Group–B | 40.0°C | 40.9°C | Disk–B3 IIIi |
| .. | | | | | | | | |
| Disk–B4 IVii | B | 4 | IV | ii | Group–X | 40.0°C | 41.1°C | |
| Disk–B5 IVii | B | 5 | IV | ii | Group–X | 40.0°C | 41.1°C | |
| .. | | | | | | | | |

1801, 1802, 1803, 1804, 1805, 1806

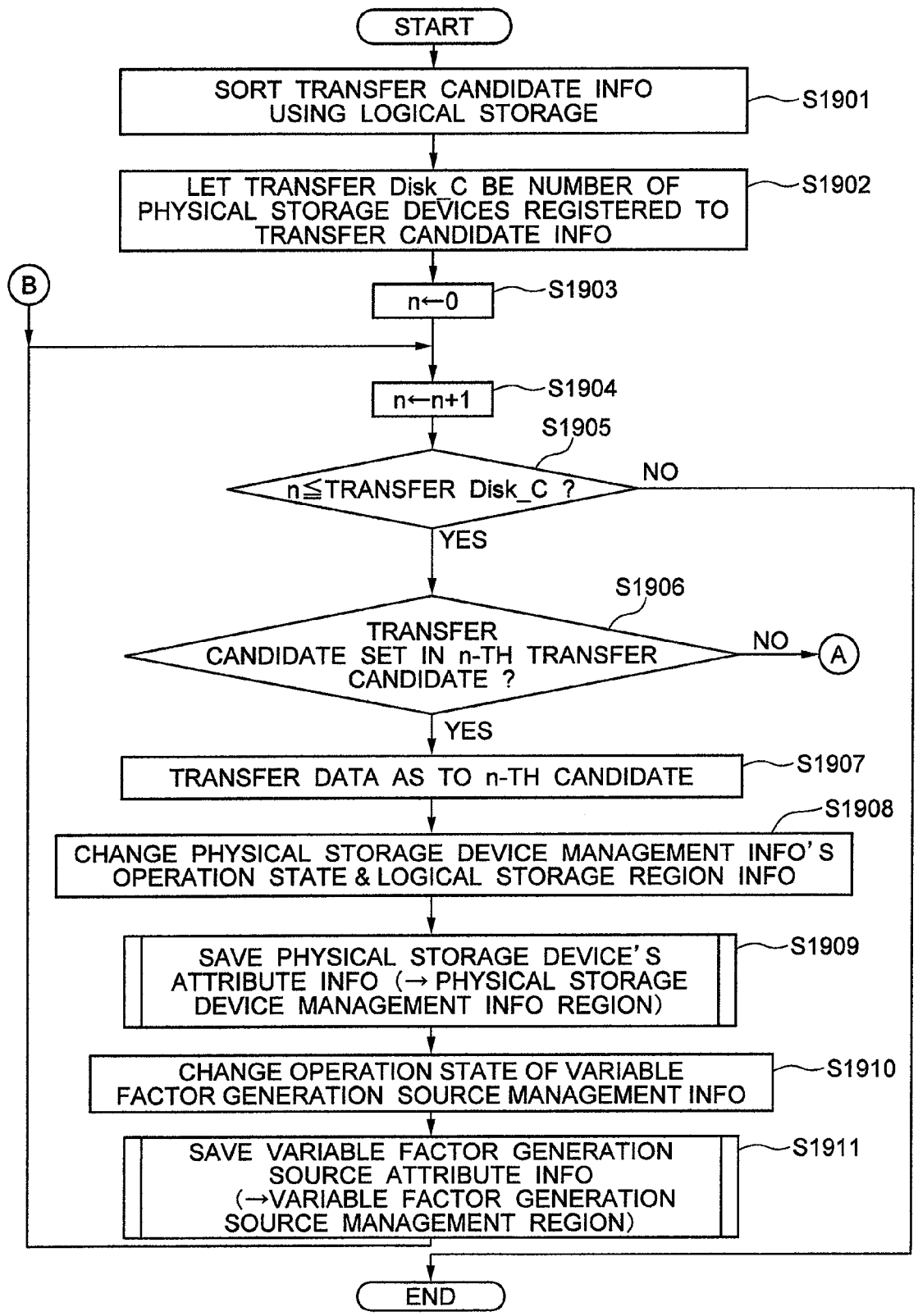

FIG. 20

3111 TRANSFER DESTINATION DETECTION POLICY

| DETECTION POLICY # | DETECTION POLICY PRIORITY | | | | | |
|---|---|---|---|---|---|---|
| | 1 | | 2 | | 3 | |
| 1 | OPERATION ENV VALUE | ASCENDING ORDER | DEVICE GROUP | ASCENDING ORDER | | |
| 2 | DEVICE GROUP | SAME PRIORITY | OPERATION ENV VALUE | ASCENDING ORDER | Z-AXIS | DESCENDING ORDER |
| 3 | DEVICE GROUP | SAME PRIORITY | Y-AXIS | ASCENDING ORDER | Z-AXIS | ASCENDING ORDER |
| .. | | | | | OPERATION ENV VALUE | ASCENDING ORDER |

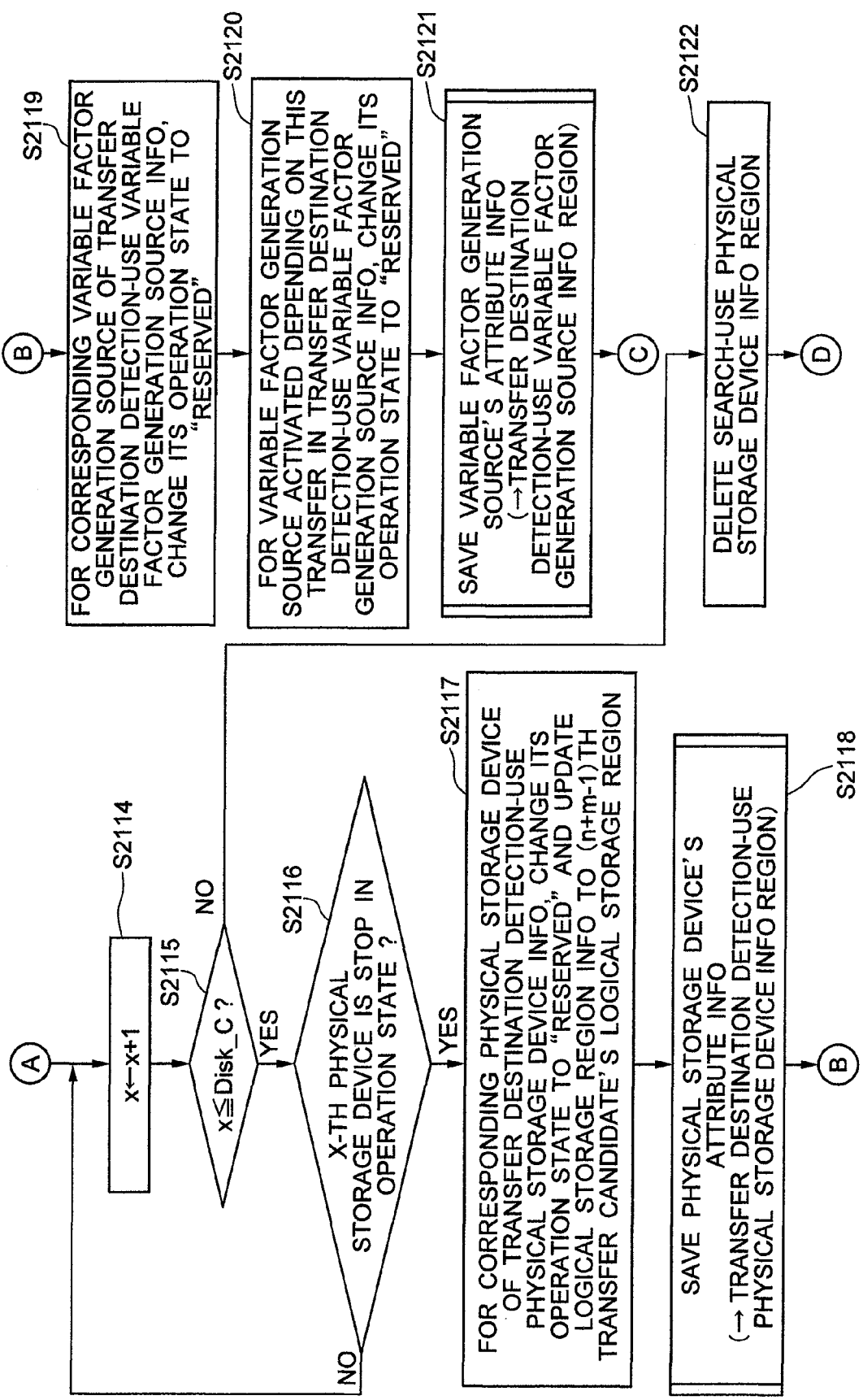

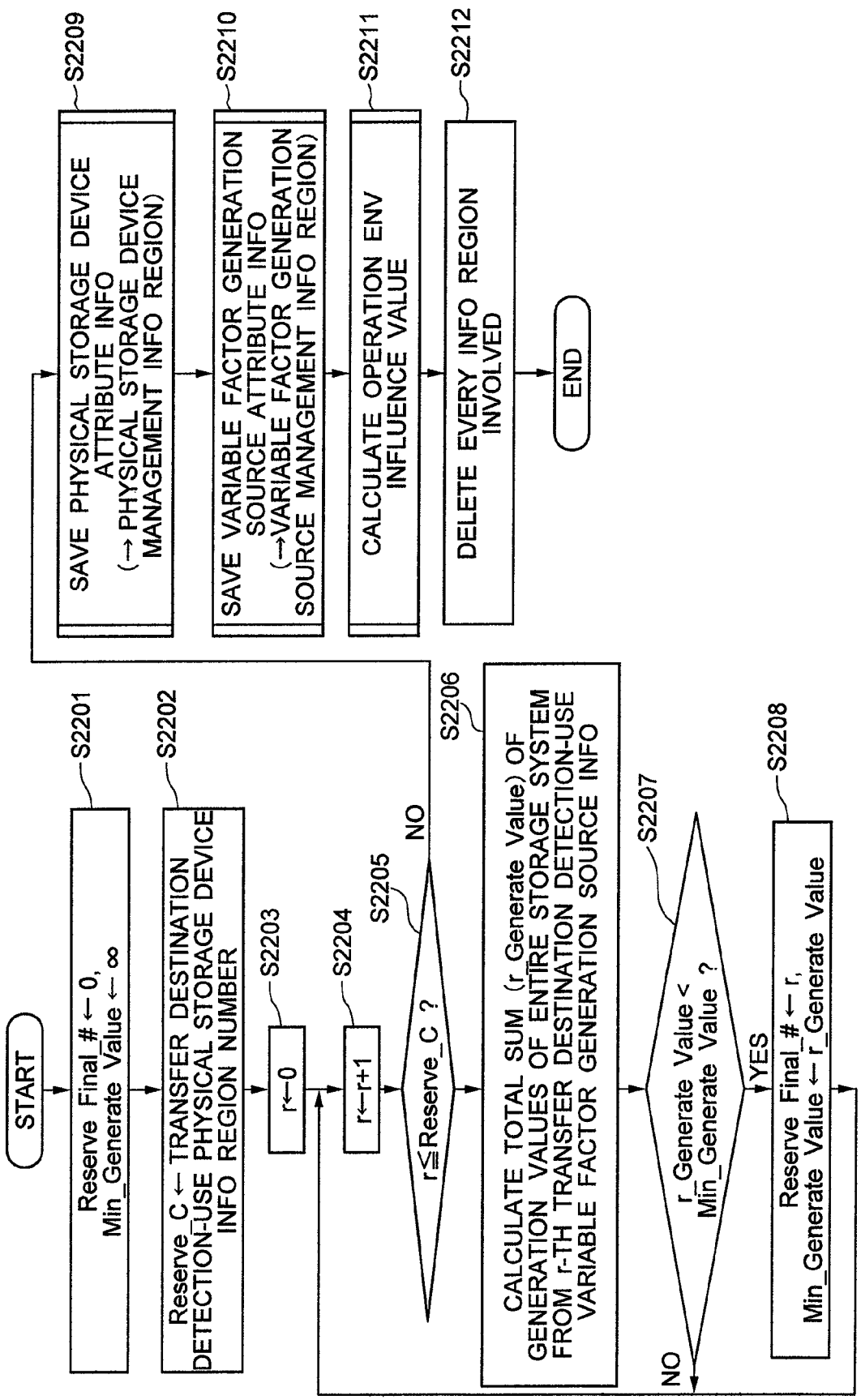

STORAGE MANAGEMENT SERVER AND STORAGE CONFIGURATION RELOCATING METHOD

INCORPORATION BY REFERENCE

The present application claims priority from Japanese application JP2008-305598 filed on Nov. 28, 2008, the content of which is hereby incorporated by reference.

BACKGROUND OF THE INVENTION

This invention relates to operation environment-dependent storage relocation realizing technologies.

A storage system is generally arranged to have at least one storage apparatus, such as a disk array subsystem or like equipment. This storage apparatus includes physical devices such as hard disk drives (HDDs) and/or semiconductor memory drives or else, which are disposed in an array form for providing storage regions based on a redundant array of independent (inexpensive) disks-i.e., RAID. The storage system also includes a host computer (referred to as the "host" hereinafter), which gives access to the storage regions provided by the storage apparatus to thereby perform data read/write operations. The storage system further includes a storage management server, which has its built-in storage unit and control device for managing the storage apparatus and host and also connection therebetween.

In this type of storage system, a means is used for more readily relocating the data that is distributed among a plurality of storage regions of storage apparatus, thereby enabling efficient use of storage system resources. One approach to doing this is disclosed in JP-A-2006-099748.

In JP-A-2006-099748, a technique is proposed for achieving the efficient storage usage by paying attention to the life cycle of data being stored in storage region to thereby perform hierarchical management of storage regions based on attribute information belonging to the storage regions per se, such as storage region's RAID level, constituent physical device type(s), storage capacity, in-use condition, etc., and relocating data to a different hierarchical level or "layer" of storage region in accordance with the policy of a user who uses the data.

SUMMARY OF THE INVENTION

Recent advances in information technology (IT) infrastructures result in a rapid increase in amount of data to be stored. In this technical background, data-saving storage systems expand in scale and, simultaneously, physical devices are becoming higher in integration in order to increase the storage capacity per storage device, which leads to a noticeable increase in amount of an energy to be consumed by an entirety of the storage system. A currently developed approach to coping with such circumstances and minimizing energy consumption of the entire storage system is to design the system to have a built-in control mechanism for temporarily halting those physical devices with no input/output sessions being occurred with respect to the stored data thereof.

Unfortunately, the approach fails to take into consideration the amount of heat to be generated by the storage system per se. Prior known systems are designed to use a cooling device, which is merely rendered operative without recognizing temperatures and positions of presently operating physical devices. Accordingly, this system design suffers from decreased cooling efficiency in such the operation environment, and thus is encountered with a problem as to the incapability of minimizing the amount of an energy to be consumed for the device cooling purpose.

Another problem faced with the prior known storage system is the risk that relocation of storage configuration with respect to a presently operating physical device(s) can result in local deterioration of the operation environment of a storage configuration after the relocation. This results in a decrease in reliability of the storage system per se and also in an increase in system maintenance costs.

The principal concept of the above-stated technique as taught from JP-A-2006-099748 lies in selection of a storage region which is deemed suitable for the data life cycle. This Japanese patent bulletin is silent about any storage configuration relocation technique which takes account of the operation environment of a physical device when it begins to operate.

It is therefore an object of this invention to provide a technique for realizing storage configuration relocation in an operation environment-dependent way.

To attain the foregoing object, this invention provides a storage configuration relocation technique for collecting certain kinds of parameters of physical devices, including but not limited to position information, operation environment values (e.g., physical device temperatures) and an operation environment threshold value (e.g., threshold level of temperatures at which physical devices operates safely), and for storing and displaying these data collected.

Furthermore, position information of a variable factor generation source which causes physical devices to vary in operation environment and a generation value (e.g., electrical power of physical device) of such variable factor generation source are also collected, stored and displayed while calculating the degree of influenceability of the variable factor generation source against physical devices along with an affected operation environment value.

In addition, the operation environment value of a given physical device is compared to the operation environment threshold value of this physical device or, alternatively, to an affected operation environment value of this physical device due to its associated variable factor generation source. Based on this comparison result, the operating position of physical device is moved.

With this arrangement, it becomes possible for a storage system administrator to recognize a present operation environment, including physical positions of data-storing physical devices and temperatures of physical devices. It is also possible for the administrator to recognize the position and influenceability of a variable factor generation source(s) with respect to physical devices. Additionally, comparing present operating states of physical devices to the operation environment threshold value makes it possible to achieve the intended storage configuration relocation for optimizing physical device operation environments. This makes it possible to minimize storage system operations/maintenance costs, including the storage system's environment sustenance cost as will be described in detail later.

According to this invention, it is possible to realize the operation environment-dependent storage configuration relocation.

BRIEF DESCRIPTION OF THE DRAWINGS

FIG. 3 is a diagram showing layout examples of physical storage devices and others making up a storage apparatus which is provided at a location.

FIG. 4 is a diagram showing a data structure of physical storage device management information.

FIG. 5 is a diagram showing a data structure of variable factor generation source management information.

FIG. 13 shows images on the physical storage device management information display screen, wherein part (a) is an image with designation of X-axis values only, and part (b) is an image with designation of Y-axis values only.

FIGS. 17A and 17B are a flowchart showing an operation environment threshold value monitoring procedure.

FIG. 18 is a diagram showing a data structure of transfer candidate information.

FIGS. 19A and 19B are a flowchart showing a process for data transfer control.

FIG. 20 is a diagram showing a data structure of transfer destination detection policy.

FIGS. 21A-21B are a flowchart showing transfer destination detection processing.

FIG. 22 is a flowchart showing transfer destination reservation settlement processing.

DETAILED DESCRIPTION OF THE INVENTION

A currently preferred form (referred to hereinafter as embodiment) for implementation of this invention will be described with reference to the accompanying drawings below.

(System Configuration)

Figure 1:
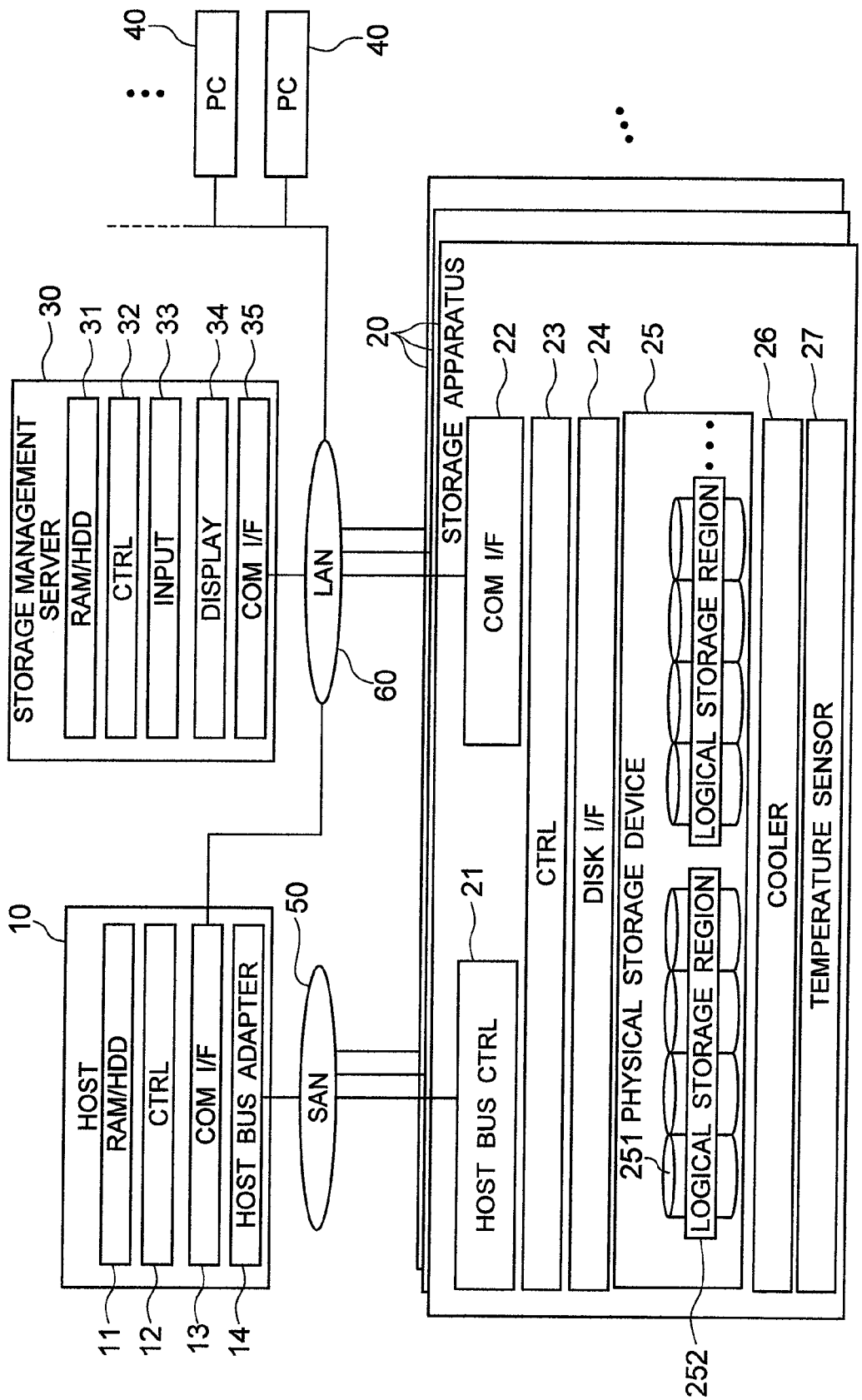
FIG. 1 is a diagram showing an overall configuration of a storage system in accordance with one preferred embodiment of this invention.

FIG. 1 shows an overall configuration of a storage system in accordance with one embodiment of this invention. This storage system is generally made up of a host computer 10, a plurality of storage apparatuses 20, a storage management server 30 and two or more user computers 40. The host 10 and storage apparatuses 20 are communicably coupled together via a storage area network (SAN) 50. The host 10, storages 20, server 30 and computers 40 are communicably interconnected via a local area network (LAN) 60.

The host 10 may typically be a file server, which includes several hardware components, such as a storage unit 11, control unit 12, communication interface (I/F) 13, and host bus adapter 14.

The host's storage 11 is for storing therein software programs for executing prespecified kinds of processing tasks and data associated therewith. Examples of the host storage 11 are a random access memory (RAM) and hard disk drive (HDD) or else. The controller 12 is a central processing unit (CPU), for example, which executes any one of the programs stored in the storage 11. The communication I/F 13 mainly functions to interface communications between any two of the storage apparatus 20, storage management server 30 and computer 40 via LAN 60. The host bus adapter 14 performs data-blocked communications with storage apparatus 20 via SAN 50.

The individual storage apparatus 20 is for storing data of the host 10 coupled thereto and is arranged to have hardware components, such as a host bus controller 21, communication I/F 22, control unit 23, disk I/F 24, storage module 25, cooling device (dependent operational device) 26, and temperature sensor 27.

The host bus adapter 21 mainly functions to make data-blocked communications with the host 10 via SAN 50. The communication I/F 22 interfaces communications between any two of the host 10, storage management server 30 and computer 40 via LAN 60. The controller 23 is a CPU for example, which executes one of the programs stored in the host storage 11. The disk I/F 24 is for interconnection between the controller 23 and any one of physical storage devices 251 which are provided in the storage unit 25, and for interfacing data input/output (I/O) processing, such as reading or writing with respect to the physical storage devices 251.

The storage unit 25 of each storage apparatus 20 has a plurality of physical storage devices 251. These physical storage devices 251 are HDDs for example, which constitute a RAID group. This RAID group has storage regions, some or all of which are used to create logical storage regions 252, which are provided to external equipment. Accordingly, a physical storage device or devices 251 making up a logical storage region 252 are defined. The individual physical storage device 251 forming such logical storage region 252 is changeable dynamically, in particular, in accordance with an operation environment of the physical storage device 251 per se, such as its heat amount, etc.

The storage unit 25 also has a cache memory (not shown) which stores write data that was written from the host 10 by I/O processing or read data as read out of host 10.

The cooling device 26 is, for example, an air-conditioning machine, which is rendered operative in a way dependent upon activation of a physical storage device 251, for sending air to physical storage device 251 to thereby cool the physical storage device 251. It should be noted that the above-stated physical storage devices 251 and cooling device 26 will be generically called "physical devices" for purposes of convenience in explanation. In addition, a physical device which affects the operation environment in a physical device group that is placed at a certain position will be called "variable factor generation source." In this embodiment, examples of the variable factor generation source are physical storage device 251 and cooling device 26.

The temperature sensor is, for example, a non-contact type thermocouple temperature sensor, which detects a temperature of each physical storage device 251. The temperature detected is sent to the storage management server 30 as an operation environment value, which is the temperature of a target physical storage device 251.

The storage management server 30 is equipped with several hardware components, such as a storage unit (storage management server-use storage) 31, control unit (storage management server-use controller) 32, input unit (storage management server-use input unit) 33, display device (storage management server-use display) 34, and communication I/F 35.

The server's storage 31 is a RAM or HDD as an example, which stores prespecified processing-executable programs and data relating thereto. The controller 32 is, for example, a CPU which executes a program(s) stored in the server storage 31. An example of the input unit 33 is a keyboard with or without a pointing device, called the mouse, for accepting entry of data and/or instructions from a storage system administrator or like personnel. The display device 34 may be a display monitor, which visually displays on its screen the information as to operation environments in a way as will be described later. The communication I/F 35 mainly functions to interface communications between any two of the host 10, storage apparatus 20 and computer 40 via LAN 60.

The computer 40 is a workstation or personal computer (PC) used by users. This user computer has a CPU (not depicted) which executes a chosen application program loaded into its internal memory (not shown), e.g., web browsing software, thereby causing a computer display (not shown) to display on its screen the information as to operation environments to be later described.

An explanation will next be given of a software arrangement of the storage management server 30.

Figure 2:
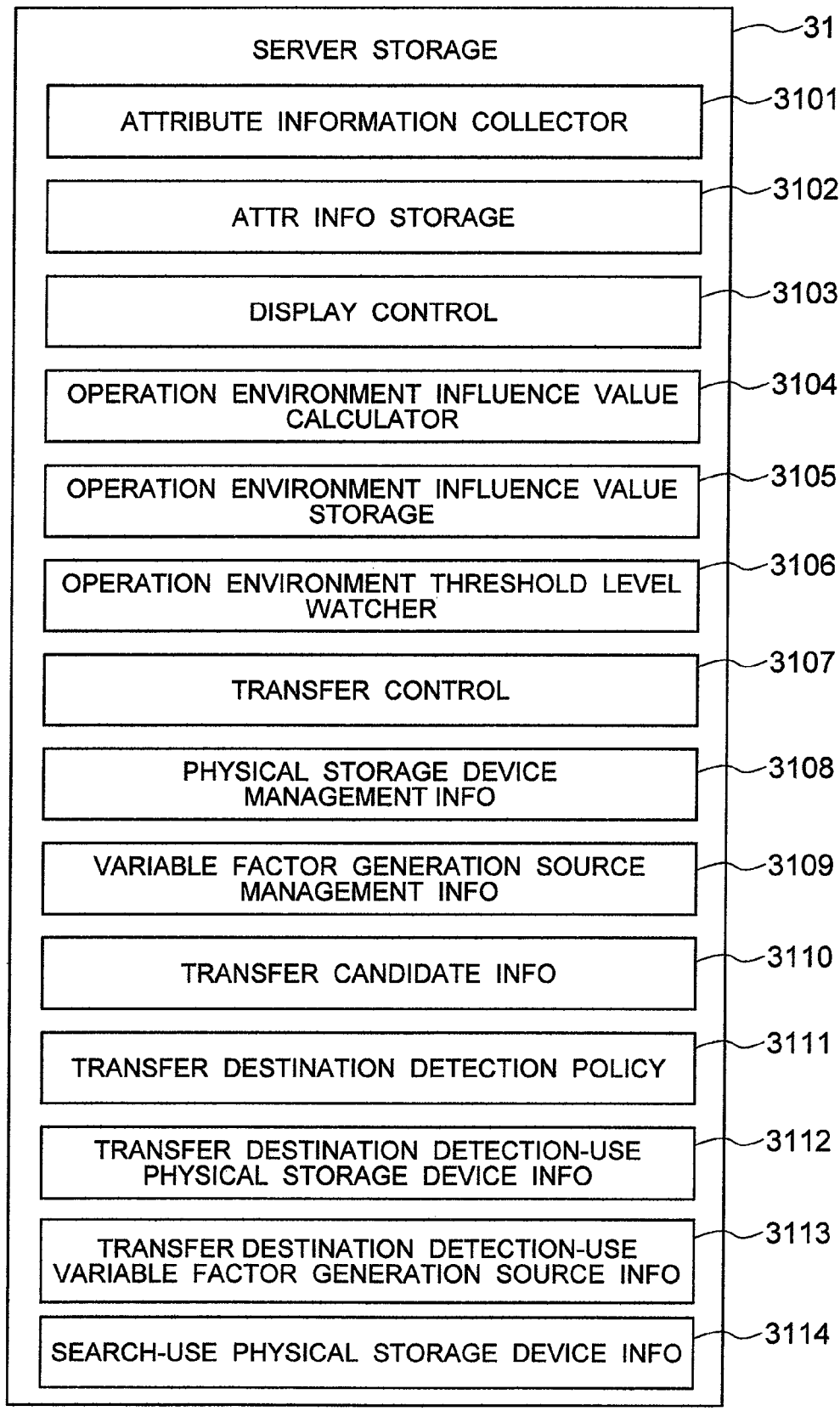
FIG. 2 is a diagram showing a software program and information which are stored in a storage unit of a storage management server.

FIG. 2 shows software programs and items of information, which are saved in the storage unit 31 of storage management server 30. In this server storage 31, there are installed several programs, such as an attribute information collecting part 3101, attribute information storing part 3102, display controlling part 3103, operation environment influence value calculating part 3104, operation environment influence value storing part 3105, operation environment threshold value monitoring part 3106, and transfer control part 3107. Also stored in the server storage 31 are physical storage device management information 3108, variable factor generation source management information 3109, transfer candidate information 3110, transfer destination detection policy 3111, transfer destination detection-use physical storage device information 3112, transfer destination detection-use variable factor generation source information 3113 and search-use physical storage device information 3114.

The attribute information collecting part 3101 has its main function to collect physical device attributes from respective physical devices as attribute information including values indicative of positions and operation states of such devices. A detailed explanation of the attribute information will be given later.

The attribute information storing part 3102 functions to store the attribute information collected by the attribute information collecting part 3101. Attribute information collected from the physical storage devices 251 is stored in the physical storage device management information 3108 whereas attribute information gathered from variable factor generation sources is saved in the variable factor generation source management information 3109.

The display control part 3103 has its function to cause either the server's display device 34 or the display of computer 40 to display in a predetermined form the contents of the physical storage device management information 3108 and variable factor generation source management information 3109. Regarding the display form, a detailed explanation will be given later.

The operation environment influence value calculating part 3104 functions to calculate as the operation environment influence value a value of the influence relative to the operation of a given physical storage device 251. More specifically, this value is the one that is for evaluation of a level of influenceability, which indicates how much the physical storage device 251 of interest increases in temperature due to application of heat to be generated by the operation of a variable factor generation source existing near or around such physical storage device 251.

The operation environment influence value storing part 3105 functions to store the operation environment influence value of any given physical storage device 251 in the physical storage device management information 3108.

The operation environment threshold value monitoring part 3106 functions to monitor or "watchdog" physical device operations for determination of whether a given physical storage device 251 is operating safely. More precisely, it judges whether the monitored temperature of physical storage device 251 at a present time point exceeds a specific temperature that is indicated as an operation environment threshold value, which is a threshold of the operation environment value as predefined to each physical storage device 251. This judgment is done periodically at fixed time intervals or, alternatively, opportunistically upon receipt of a request from external equipment, such as the storage management server 30.

The transfer control part 3107 functions to copy the data being stored in a physical storage device 251 that becomes the transfer source to another physical storage device 251 that becomes the transfer destination to thereby achieve storage configuration relocation.

The physical storage device management information 3108 is the information that combines or "assembles" together various kinds of attribute information of respective physical storage devices 251 in a prespecified format, which information is stored by processing operations of the attribute information storing part 3102 and operation environment influence value storing part 3105. This information will be described in detail later.

The variable factor generation source management information 3109 is the information that bundles together several items of attribute information of respective variable factor generation sources in a prespecified form, which information is then stored by processing of the attribute information storing part 3102. Details of this information will be set forth later.

The transfer candidate information 3110 is the one that combines together in a predefined form those information items (e.g., attribute information) concerning a data transfer candidate, which is a candidate of a physical storage device 251 that is appropriate to become a data transfer source. This transfer candidate information 3110 is temporarily saved by processing of the attribute information storing part 3102. Details of this information will be discussed later.

The transfer destination detection policy 3111 is the information that assembled together, as a detection policy in a specified form, those policies each defining the degree of priority as to an order of detection of the physical storage device 251 that becomes the transfer destination. This detection policy is prepared, for example, by means of a manual operation of the input unit 33 by the administrator of the storage management server 30. Details of this information will be stated later.

The transfer destination detection-use physical storage device information 3112 is the one that bundles in a specified form the information as to a physical storage device or devices 251 detected as the transfer destination, which information is substantially the same as the physical storage device management information 3108. The transfer destination detection-use physical storage device information 3112 is temporarily stored by processing of the attribute information storing part 3102 in order to execute the processing to be performed by the transfer control part 3107. Details of this information will be discussed later.

The transfer destination detection-use variable factor generation source information 3113 is the information that assembles in a predefined format the information as to a variable factor generation source detected as the transfer destination, which information is substantially the same as the variable factor generation source management information 3109. This transfer destination detection-use variable factor generation source information 3113 is temporarily stored by processing of the attribute information storing part 3102 in order to execute the processing by means of the transfer control part 3107. Details of this information will be stated later.

The search-use physical storage device information 3114 is the one that assembled in a specified form the information about those physical storage devices 251 which are searched for detection of a transfer destination and is substantially the same as the physical storage device management information 3108. The search-use physical storage device information 3114 is temporarily stored by processing of the attribute information storing part 3102 in order to execute the processing by means of the transfer control part 3107. This information will be discussed in detail later.

Next, an explanation will be given of the physical storage devices 251 making up storage apparatus 20.

FIG. 3 shows a layout example of those physical storage devices constituting one storage apparatus provided at a location or site. As shown at part (a) of FIG. 3, physical storage devices and cooling device which constitute a physical storage device group-A are laid out in such a manner that these are received within a partition as indicated by broken lines. This partition is added sequence numbers (X coordinate values) "1," "2," "3, " . . . in the direction of X-axis and numbers (Y coordinate values) "I," "II," "III," . . . in the direction of Y-axis and also numbers (Z coordinate values) "i," "ii," "iii," . . . in the direction of Z-axis. With these X-Y-Z coordinates, the position of any one of the physical storage and cooling devices that are disposed within the partition is specifiable. Specified positions are collected by the attribute information collecting part 3101 as the position information of physical storage devices or variable factor generation sources.

Additionally, at part (a) in FIG. 3, a logical storage region labeled "Group-A" is created in an ensemble of those physical storage devices which are at positions with X-Y-Z coordinates of (1, I, i), (2, I, i), (1, II, i) and (2, II, i). When the ensemble of such physical storage devices belonging to the logical storage region Group-A is in operation, it is possible for either the administrator of storage management server 30 or a user of computer 40 to execute the processing of the data being stored in the logical storage region Group-A. Any logical storage regions created are collected by the attribute information collecting part 3101 as logical storage region information of the physical storage devices involved.

The same goes with a physical storage device group "Group-B" shown at part (b) of FIG. 3: those physical storage devices and their associated cooling device(s) included in this physical storage device group-B are disposed in such a manner as to be received within a partition indicated by broken lines.

A logical storage region labeled "Group-B" is generated in an ensemble of those physical storage devices which are at certain positions with X-Y-Z coordinates of (1, II, i), (2, II, i), (3, II, i), (1, III, i), (2, III, i) and (3, III, i). A logical storage region "Group-C" is formed in an ensemble of physical storage devices which are at positions with X-Y-Z coordinates of (4, I, i), (5, I, i), (4, II, i) and (5, II, i).

A detailed explanation will next be given of the physical storage device management information 3108.

FIG. 4 shows a data structure of the physical storage device management information. The physical storage device management information 3108 has several fields including a physical storage device management identifier (ID) 401, position information 402, operation state 403, logical storage region information 404, operation environment threshold value 405, operation environment value 406, operation environment influence value 407 and affected operation environment value 408, and is configured in a table form while letting the physical storage devices 251 making up the storage system be records.

The physical storage device management ID 401 has a value that is registered thereto for identification or discrimination of a physical storage device 251. Examples of this value used and determined are an equipment name (Disk) of physical storage device, a group name (such as A, B. etc.) of physical storage device group belonging thereto, and a layout position of physical storage device (such as X-Y-Z coordinate value of (1, I, i) or else).

To the position information 402, a value that specifies the position of each physical storage device 251 is registered. Examples of this value are a device group ID which is the name (such as A, B, etc.) of a physical storage device group to which a physical storage device belongs, a position in the X-axis direction of physical storage device (such as "1" or else), a position in the Y-axis direction of physical storage device (such as "I" or else), and a position in the Z-axis direction of physical storage device (such as "i" or else).

Registered to the operation state 403 is a value which identifies an operation state of physical storage device 215. Major examples of the operation state are a "in-operation" state which enables execution of I/O processing, an "in-halt" state which disables execution of I/O processing, and a "reserved" state indicating that a presently halted device will be switched to get its operation started to thereby satisfy prespecified conditions.

Registered to the logical storage region information 404 is the label name (such as "Group-A" or else) of a logical storage region to which a physical storage device 251 belongs. In cases where the operation state is presently set to the in-halt, this name is not registered because of the absence of any belonging logical storage region. In case the operation state is in reservation, the name of a logical storage region is registered, which is determined by specific processing to be later described.

Registered to the operation environment threshold value 405 is an operation environment threshold value which is a threshold of operation environment value (in this embodiment, temperature (° C.)) for guaranteeing safe operations of physical storage devices 251. This operation environment threshold value may be designated from the input unit 33 of storage management server 30 or, alternatively, determined by specifications of physical storage devices 251.

Registered to the operation environment value 406 is a temperature of physical storage device 251 as acquired from the temperature sensor 27 stated supra.

Registered to the operation environment influence value 407 is an operation environment influence value which is calculated by the operation environment influence value calculating part 3104 in case storage configuration relocation is performed by the transfer control part 3107. This operation environment influence value is calculated based on a temperature and position of a target physical storage device 251 and also temperatures and positions of other physical storage devices 251.

Registered to the affected operation environment value 408 is an estimated value of operation environment value after having executed storage configuration relocation by the transfer control part 3107 as an affected operation environment value. More specifically, this affected operation environment value is a total sum of an operation environment value and operation environment influence value.

The operation environment threshold value 405, operation environment value 406, operation environment influence value 407 and affected operation environment value 408 constitute operation environment information. This operation environment information is one of physical storage device attribute information items, similarly to the position information, operation state and logical storage region information.

Detailed explanation will next be given of the variable factor generation source management information 3109.

FIG. 5 shows a data structure of the variable factor generation source management information. The variable factor generation source management information 3109 has several fields including a variable factor generation source management ID 501, position information 502, generation source type 503, operation state 504 and generation value 505, and is formed in a table form while letting those variable factor generation sources used in the storage system be records.

To the variable factor generation source management ID 501, a value which discriminates (classifies) a variable factor generation source from the others is registered. Examples of this value are an equipment name of cooling device (e.g., fan), a label name (such as A, B, etc.) of physical storage device group with a variable factor generation source belonging thereto, and a layout position of variable factor generation source (such as X-Y-Z coordinate value of (1, I, i) or else), which are used and determined.

Registered to the position information 502 is a value which specifies the position of a variable factor generation source. Examples of this value used are a device group ID which is a name (such as A, B, etc.) of physical storage device group with a variable factor generation source belonging thereto, a position in the X-axis direction of a variable factor generation source (such as "1" or else), a position in Y-axis direction of variable factor generation source (such as "I" or else), and a position in Z-axis direction of variable factor generation source (such as "i" or else).

Registered to the generation source type 503 is a value which indicates the type or kind of a variable factor generation source. In this embodiment a value of "Disk" is registered if the variable factor generation source is a physical storage device; a value of "Fan" is registered if it is a cooling device.

Registered to the operation state 504 is a value which specifies an operation state of a variable factor generation source. In case the variable factor generation source is a physical storage device, the operation state becomes the same as that of the operation state 403.

Registered to the generation value 505 is an electric power value (W) per unit time as a consumed energy when a variable factor generation source is rendered operative. This power value is added a sign "+" which indicates deterioration of the operation environment of its nearby variable factor generation source(s)—more precisely, unwanted increase in temperature of such nearby variable factor generation source(s)—and a sign "−" which indicates amelioration of the operation environment of the nearby variable factor generation source(s)—that is, decrease in temperature thereof. For example, when letting a cooling device with its operation environment value of "Fan-A4Ii" get activated, there is expected a decrease in temperature of its nearby physical storage device, which is equivalent to −15.0 W. Note here that an entire consumed energy in a certain storage apparatus is representable by a sum of the absolute values of generation values of respective variable factor generation sources.

In FIG. 4, physical storage devices (indicated by reference numeral 411) of "Disk-B2 II i" and "Disk-B3 II i" with operation environment values being equal to 40.9° C. are in excess of the operation environment threshold value; so, it is necessary to copy their storing data to another physical storage device(s). Here, data transfer control is performed in a way such that the data is copied to physical storage devices of "Disk-B1 III i" and "Disk-B2 III i" and "Disk-B3 III i," wherein these devices are common in logical storage region information of "Group-B." When an attempt is made to set to reservation (see reference numeral 412) the operation states of those physical storage devices with "Disk-B1IIIi," "Disk-B2IIIi" and "Disk-B3IIIi" and then perform data transfer, the operation environment values (temperatures) of physical storage devices of "Disk-B1IIIi," "Disk-B2IIIi," "Disk-B3IIIi" and "Disk-B4IIIi" are expected to increase, resulting in per-device registration of an operation environment influence value indicating such temperature increase and an affected operation environment value indicating an operation environment value after the temperature increase (as indicated by numeral 413). On the other hand, due to this data transfer, the operation environment values (temperatures) of physical storage devices of "Disk-B1IIIi" to "Disk-B5IIIi" decrease, resulting in per-device registration of an operation environment influence value indicating such temperature decrease and an affected operation environment value indicating an operation environment value after the temperature decrease (see numeral 414). This leads to movement or "migration" of a heat source; so, it is very likely that a certain degree of temperature change takes place even at nearby physical storage devices, which are not involved in the transfer.

The operation state change of from "in-halt" to "reserved" which was done in FIG. 4 is similarly performed at a corresponding variable factor generation source of the variable factor generation source management information 3109 shown in FIG. 5 (see numeral 511). A method for selecting a physical storage device or else whose operation state is set to the reservation will be described later.

(Processing)

Next, a detailed explanation will be given of each kind of processing to be executed by the controller 32 of the storage management server 30.

The processing as will be stated below is the one that is executed by each processing part which is practically implemented on the storage management server 30 through process steps of loading into a storage region a software program (processing part) being stored in the storage 31 of storage management server 30 and executing this program by the controller 32. Note that each program may be prestored in the server storage 31 or may alternatively be installed via other storage media or communication media (e.g., a network or a carrier wave travelling over the network) on an on-demand basis.

A detailed explanation will first be given of the processing for collecting and storing attribute information of physical storage devices and variable factor generation sources.

Figure 6:
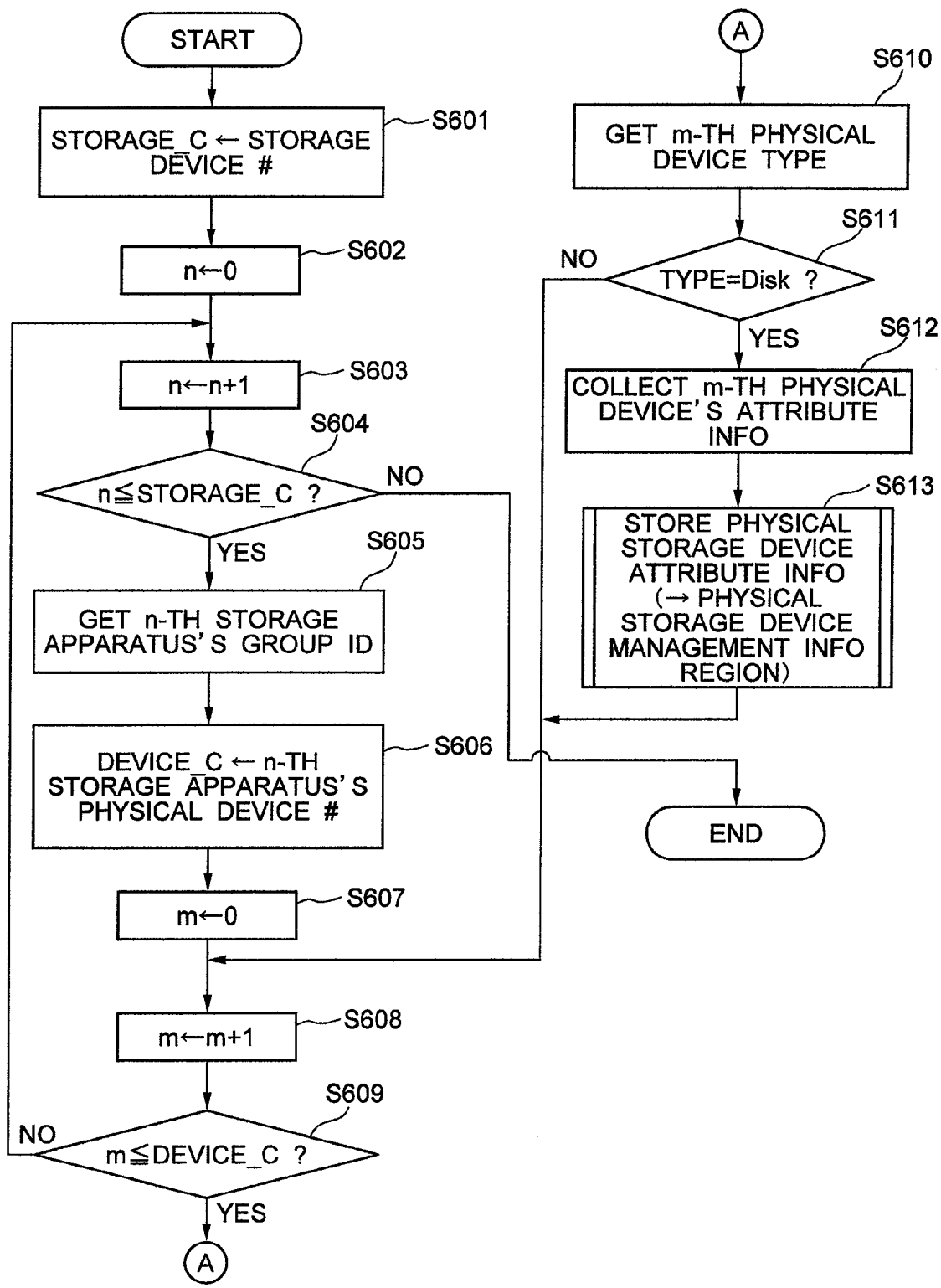
FIG. 6 is a flow chart showing a procedure for collecting attribute information of physical storage devices.

FIG. 6 is a flow chart showing physical storage device attribute information collecting processing. This processing is realized by the attribute information collecting part 3101 shown in FIG. 2. With this processing, respective items of attribute information of all physical storage devices in the storage system are collected together from each storage apparatus 20.

First, at step S601, the server's controller 32 puts for substitution a number of storage apparatuses 20 used in the storage system in the place of a variable "Storage_C." After the substitution, the procedure goes to step S602.

Next, in step S602, the controller 32 makes by substitution a variable n equal to a numerical value zero (0). After the substitution, proceed to step S603.

Next at step S603, the controller 32 performs increment of the variable n by letting it be equal to n+1 (i.e., n=n+1). After the increment, the routine goes to step S604.

At step S604, the controller 32 determines whether the variable n is not larger than the variable "Storage_C." When the former is less than or equal to the latter (that is, if Yes at step S604), proceed to step S605; otherwise (No at step S604), let this processing be ended.

Next at step S605, the controller 32 acquires a device group ID (same as the device group ID of physical storage device group) of n-th storage apparatus from such storage apparatus. After the ID acquisition, go to step S606.

Next at step S606, the controller 32 puts a physical storage device number of the n-th storage apparatus into a variable "Device_C" for substitution. After the substitution, go to step S607.

Next at step S607, the controller 32 sets a variable m to zero (m=0). Thereafter, go to step S608.

Next at step S608, the controller 32 substitutes m+1 for the variable m (m=m+1) to thereby perform increment of this variable. After the increment, go to step S609.

Next at step S609, the controller 32 judges whether the variable m is not larger than the variable "Device_C." If the former is less than or equal to the latter (i.e., Yes at step S609), proceed to step S610; otherwise (No at step S609), return to the step S603.

Next at step S610, the controller 32 acquires from the n-th storage apparatus a type of an m-th physical device (i.e., physical storage device (Disk) or cooling device (Fan)). After the acquisition, go to step S611.

Next in step S611, the controller 32 judges whether the acquired type is the physical storage device (Disk) or not. If it is the physical storage device (Disk) (i.e., Yes at step S611), proceed to step S612. Otherwise (No at step S611), the result means that the m-th physical device must be a cooling device (Fan), which is out of the target device to be handled. Thus, return to step S608.

Next at step S612, the controller 32 collects attribute information of the m-th physical device from the n-th storage apparatus. Examples of the attribute information are (1) position data (device group ID, X-axis coordinate, Y-axis coordinate and Z-axis coordinate), (2) operation state (in-operation, in-halt or reserved), (3) logical storage region information, (4) operation environment threshold value, (5) operation environment value, (6) operation environment influence value (initial value is zero), and (7) affected operation environment value (its initial value is 0). After the information collection, go to step S612.

Lastly, at step S613, the controller 32 executes the processing for storing the physical storage device attribute information collected. In this processing, the physical storage device attribute information is registered to the physical storage device management information 3108 which is stored in a physical storage device management information region that is prepared in the storage region of the server storage 31. After the execution, return to step S608.

Now, the explanation of the physical storage device attribute information collecting processing is ended.

Figure 7:
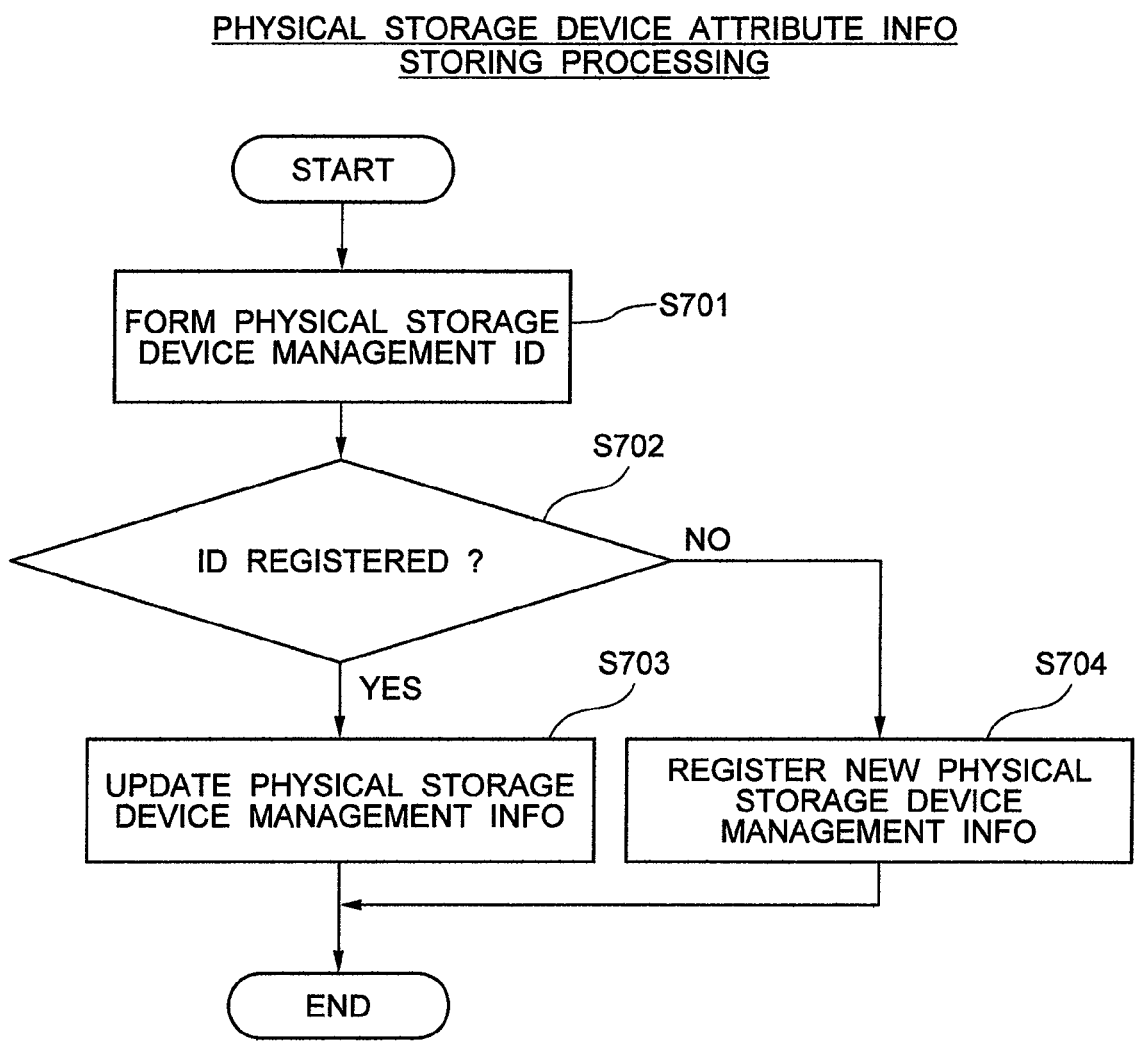
FIG. 7 is a flowchart showing a procedure for storing the attribute information of physical storage devices.

FIG. 7 is a flowchart of the processing for storing the physical storage device attribute information. This processing is executed by the attribute information storing part 3102 shown in FIG. 2. By this processing, the attribute information of every physical device in the storage system will be stored in the physical storage device management information 3108.

First, at step S701, the controller 32 prepares the physical storage device management ID of a target physical storage device (e.g., the m-th physical device shown in FIG. 6). In the physical storage device management ID preparation, there are used (1) a type of physical device (acquired from storage apparatus, such as "Disk" for example) and (2) position data, such as device group ID (e.g., B), X-axis coordinate (e.g., 1), Y-axis coordinate (e.g., III) and Z-axis coordinate (e.g., i)—for example, "Disk-B 1 III i." After having prepared it, go to step S702.

Next at step S702, the controller 32 determines whether the physical storage device management ID prepared has already been registered to the physical storage device management information 3108. Precisely, a decision is made as to whether the prepared physical storage device management ID is identical to any one of those values which are registered to the physical storage device management ID 401. If registered (i.e., Yes at step S702) then proceed to step S703; otherwise (No at step S702), go to step S704.

Next at step S703, the controller 32 updates the record that exists in the physical storage device management information 3108. Examples of the value to be updated are (1) physical storage device management ID, (2) device group ID, (3) X-, Y- and Z-axis coordinates, (4) operation state (in-operation, in-halt or reserved), (5) logical storage region information, (6) operation environment threshold value, (7) operation environment value, (8) operation environment influence value and (9) affected operation environment value.

Finally, at step S704, the controller 32 newly registers this record of physical storage device management information 3108, which did not originally exist. Examples of this newly registered value are (1) physical storage device management ID, (2) device group ID, (3) X, Y and Z-axis coordinates, (4) operation state (in-operation, in-halt or reserved), (5) logical storage region information, (6) operation environment threshold value, (7) operation environment value, (8) operation environment influence value and (9) affected operation environment value.

Now, the discussion of the physical storage device attribute information storing processing is ended.

Figure 8:
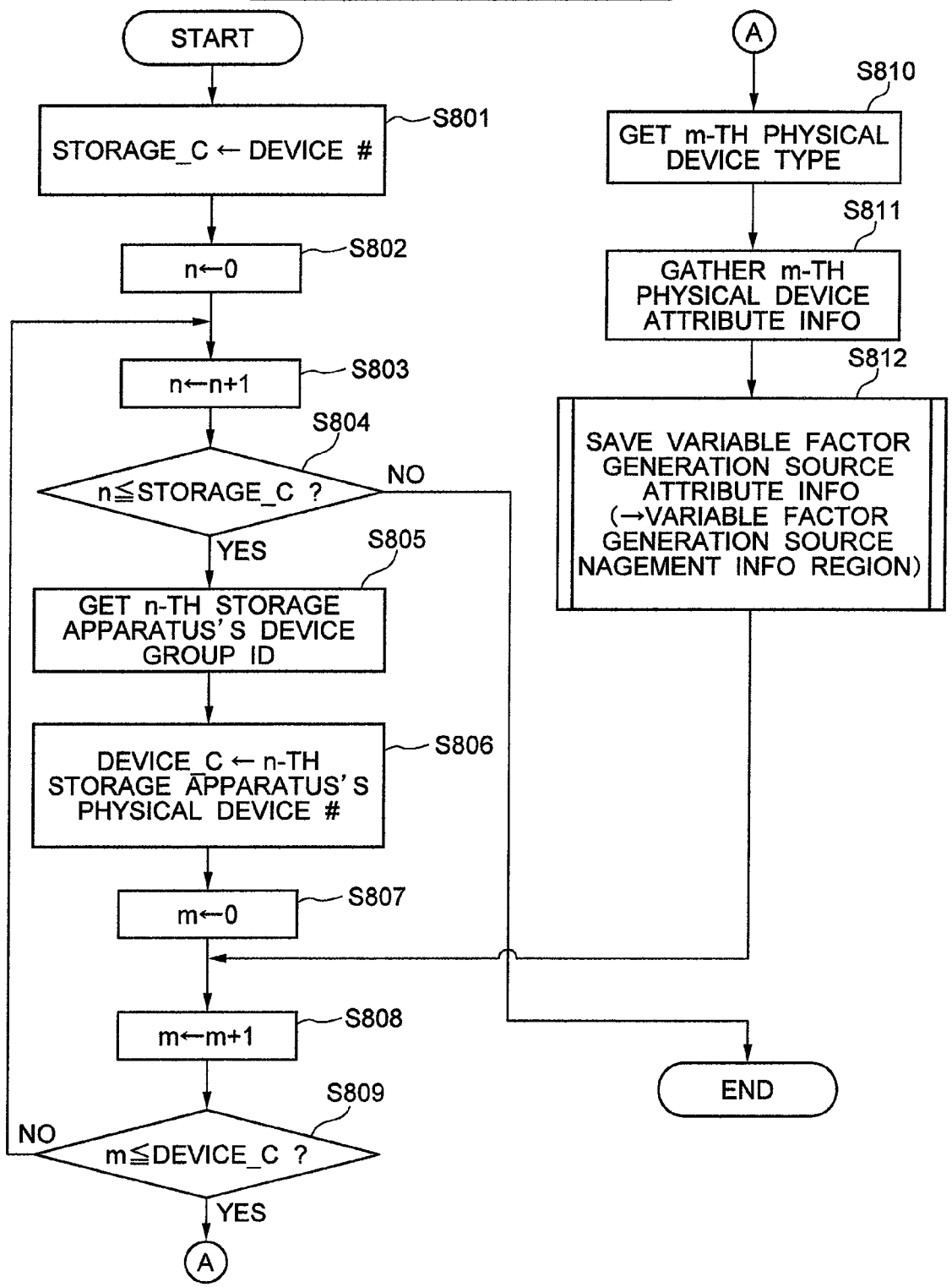
FIG. 8 is a flowchart showing a procedure for collecting attribute information of variable factor generation sources.

FIG. 8 is a flowchart of processing for collecting variable factor generation source attribute information. This processing is realized by the attribute information collecting part 3101 shown in FIG. 2. By this processing, the attribute information of every variable factor generation source included in the storage system is collected from storage apparatus 20.

First, at step S801, the server's internal controller 32 puts in the variable "Storage_C" for substitution a number of each storage apparatus 20 used in the storage system. After the substitution, proceed to step S802.

Next, at step S802, the controller 32 sets a numerical value zero (0) to variable n. Thereafter, go to step S803.

Next at step S803, the controller 32 substitutes n+1 for n to thereby perform increment of the variable n. After the variable increment, go to step S804.

Next at step S804, the controller 32 judges whether the variable n is not greater than the variable "Storage_C." If the former is less than or equal to the latter, (i.e., Yes at step S804), proceed to step S805; otherwise (No at step S804), quit this processing.

Next at step S805, the controller 32 acquires a device group ID of n-th storage apparatus (same as the device group ID of physical storage device group; for detail, see FIG. 5) from such the storage apparatus. After the ID acquisition, go to step S806.

Next at step S806, the controller 32 substitutes a physical device number of the n-th storage apparatus for a variable "Device_C." After the substitution, go to step S807.

Next at step S807, the controller 32 zeros the variable m (m=0). Then, go to step S808.

Next at step S808, the controller 32 substitutes m+1 for the variable m to perform increment of this variable. After the increment, go to step S809.

Next at step S809, the controller 32 judges whether the variable m is not larger than the variable "Device_C." If the former is less than or equal to the latter (Yes at step S809) then go to step S810; otherwise (No at step S809), return to the step S803.

Next at step S810, the controller 32 acquires from the n-th storage apparatus a type of m-th physical device (i.e., physical storage device (Disk) or cooling device (Fan)). After the acquisition, go to step S811.

Next at step S811, the controller 32 collects attribute information of the m-th physical device from the n-th storage apparatus. Examples of the attribute information collected are (1) position data (device group ID, X-, Y- and Z-axis coordinate values), (2) operation state (in-operation, in-halt or reserved), and (3) generation value. After the collection, go to step S812.

Lastly at step S812, the controller 32 executes processing for storing the variable factor generation source attribute information thus collected. Note that in this processing, the variable factor generation source attribute information is registered to the variable factor generation source management information 3109 which is stored in a variable factor generation source management information region that is prepared in the storage region of the server storage 31. After the execution, return to step S808.

Now, the explanation of the variable factor generation source attribute information collecting processing is ended.

Figure 9:
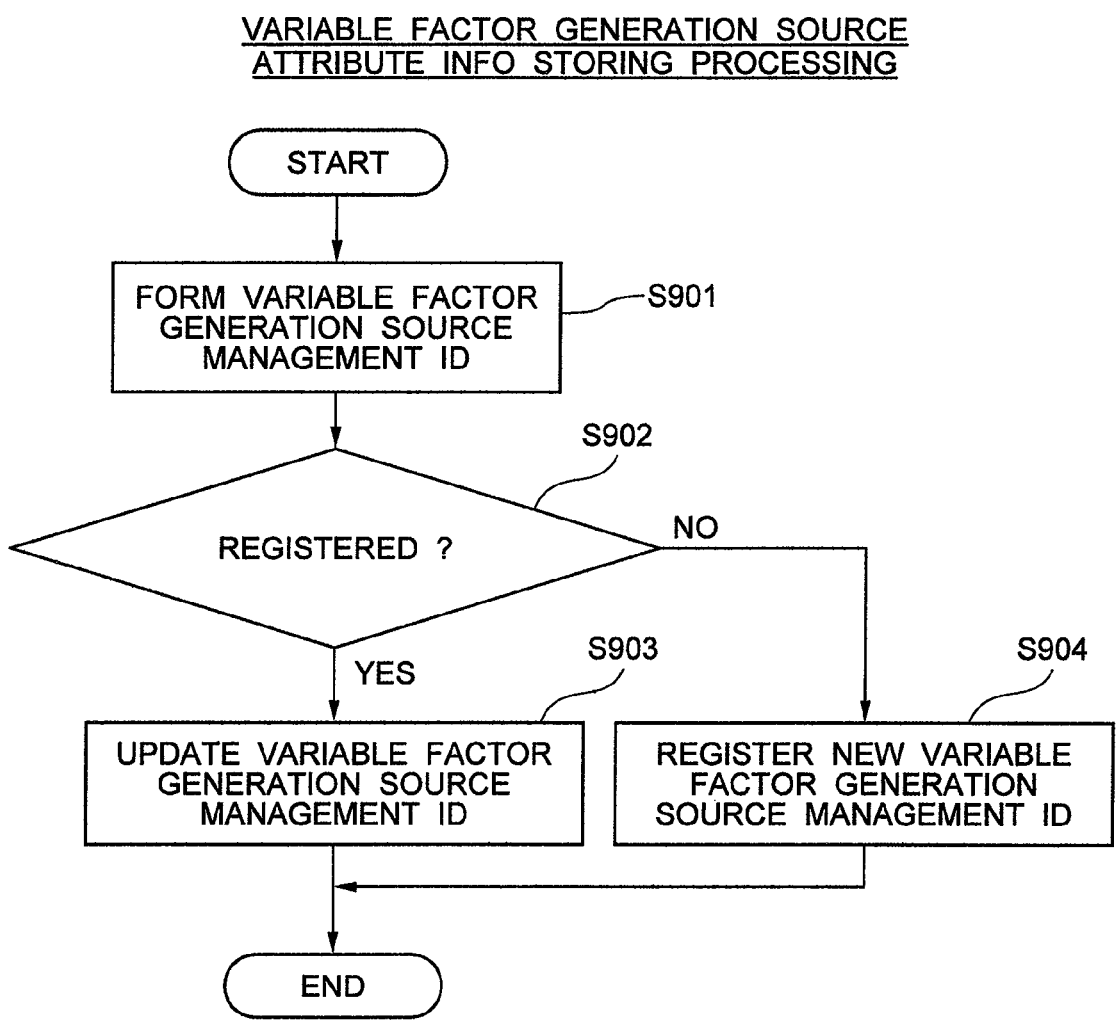
FIG. 9 is a flowchart showing a procedure for storing the attribute information of variable factor generation sources.

FIG. 9 is a flowchart of processing for storing the variable factor generation source attribute information collected. This processing is realized by the attribute information storing part 3102 of FIG. 2. By this processing, the attribute information of every variable factor generation source provided in the storage system will be stored in the variable factor generation source management information 3109.

Firstly, at step S901, the controller 32 prepares a variable factor generation source management ID of target variable factor generation source (e.g., the m-th physical device shown in FIG. 6). In the preparation of the variable factor generation source management ID, there are used (1) a type of physical storage device (acquired from storage apparatus, such as "Fan" for example) and (2) position data, such as device group ID (e.g., B), X-axis coordinate (e.g., 6), Y-axis coordinate (e.g., II) and Z-axis coordinate (e.g., i), an example of which is "Fan-B 6 II i." After the preparation, go to step S902.

Next at step S902, the controller 32 judges whether the variable factor generation source management ID thus prepared has already been registered to the variable factor generation source management information 3109. More precisely, a decision is made as to whether the prepared variable factor generation source management ID is identical to any one of those values that are presently registered to the variable factor generation source management ID 501. If registered (i.e., Yes at step S902) then proceed to step S903; otherwise (No at step S902), go to step S904.

Next at step S903, the controller 32 updates the already existing record of the variable factor generation source management information 3109. Examples of the value to be updated are (1) variable factor generation source management ID, (2) device group ID, (3) X-, Y- and Z-axis coordinates, (4) generation source type, (5) operation state (in-operation, in-halt or reserved), and (6) generation value.

Lastly at step S904, the controller 32 newly registers this record of variable factor generation source management information 3109, which did not originally exist. Examples of the newly registered value are (1) variable factor generation source management ID, (2) device group ID, (3) X-, Y- and Z-axis coordinates, (4) generation source type, (5) operation state (in-operation, in-halt or reserved), and generation value.

Now, the explanation of the variable factor generation source attribute information storing processing is ended.

A detailed explanation will next be given of processing for calculating and storing operation environment influence values of physical storage devices.

Figure 10:
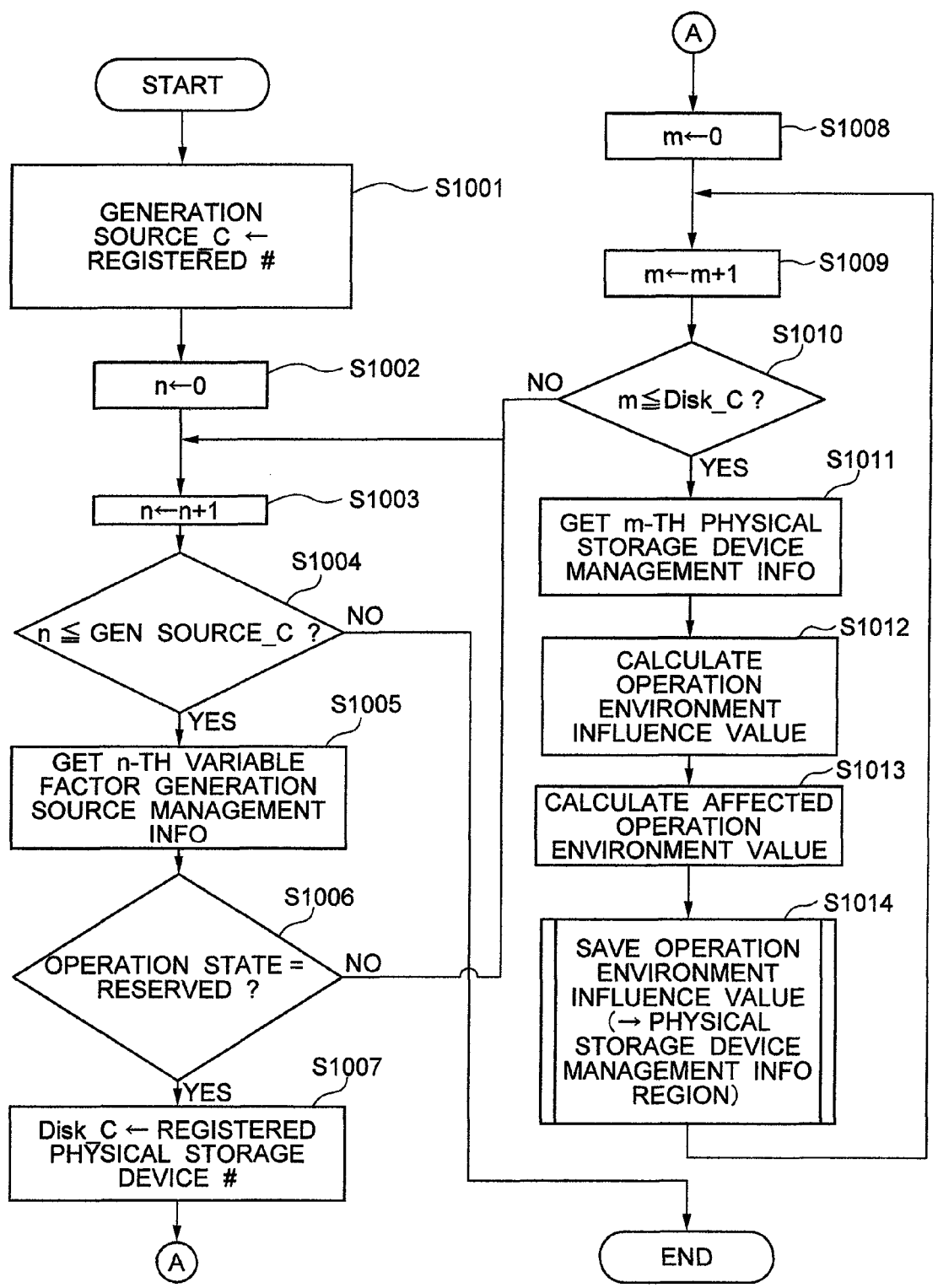
FIG. 10 is a flowchart showing a procedure for calculating an operation environment value(s).

FIG. 10 is a flowchart of the operation environment influence value calculation processing. This processing is realized by the operation environment influence value calculating part 3104 shown in FIG. 2. By this processing, there is obtained an estimated value of the influenceability (temperature increase) to be occurred at a physical storage device having its possibility to become a data transfer destination in a case where data is transferred to such the physical storage device.

First, at step S1001, the controller 32 substitutes for a variable "Generation Source_C" a number of variable factor generation sources which have already been registered to the variable factor generation source management information region, that is, a number of records of the variable factor generation source management information 3109. After the substitution, proceed to step S1102.

Next, at step S1002, the controller 32 zeros the variable n (n=0). Then, go to step S1003.

Next at step S1003, the controller 32 substitutes n+1 for the variable n to thereby perform increment of this variable n. After the increment, go to step S1004.

Next at step S1004, the controller 32 judges whether the variable n is not larger than the variable "Generation Source_C." If the former is less than or equal to the latter (i.e., if Yes at step S1004) then go to step S1005; otherwise (if No at step S1004), exit this processing.

Next at step S1005, the controller 32 acquires n-th variable factor generation source management information, i.e., the n-th record of the variable factor generation source management information 3109 which is registered to the variable factor generation source management information region. After the acquisition, go to step S1006.

Next at step S1006, the controller 32 determines whether an operation state of the acquired variable factor generation source management information, i.e., the value of operation state 504, is reservation or not. If it is reservation (Yes at step S1006) then go to step S1007; otherwise (No at step S1006), return to step S1003.

Next at step S1007, the controller 32 substitutes for a variable "Disk_C" a number of those physical storage devices which have already been registered to the physical storage device management information region, i.e., the record number of the physical storage device management information 3108. After the substitution, go to step S1008.

Next at step S1008, the controller 32 zeros the variable m (m=0). Then, go to step S1009.

Next at step S1009, the controller 32 substitutes m+1 for the variable m to perform increment of this variable. After the increment, go to step S1010.

Next at step S1010, the controller 32 judges whether the variable m is not larger than the variable "Disk_C." If m is less than or equal to "Disk_C" (Yes at step S1010) then go to step S1011; otherwise (No at step S1010), return to step S1003.

Next at step S1011, the controller 32 acquires m-th physical storage device management information, i.e., the m-th record of physical storage device management information 3108 which is registered to the physical storage device management information region. After the acquisition, go to step S1012.

Next at step S1012, the controller 32 calculates an operation environment influence value of the physical storage device that is registered as the m-th physical storage device management information. When calculating this value, an attempt is made to obtain position information (see reference numeral 402) of the m-th physical storage device management information and position information (see numeral 502) and generation value (505) of the n-th variable factor generation source management information, and use an equation which follows:

operation environment influence value=
operation environment influence value+generation value/
(distance from variable factor generation source+1)^2.

The operation environment influence value at the first term on the right side of the equation above is a value of influence that is derived from the physical storage device per se, which is registered as the m-th physical storage device management information.

Additionally, the second term on the right side is a value of influence that the physical storage device which is registered as the m-th physical storage device management information is expected to receive from the variable factor generation source which is registered as the n-th variable factor generation source management information. Note here that the distance from variable factor generation source is a distance between the physical storage device that is registered as the m-th physical storage device management information and the variable factor generation source that is registered as the n-th variable factor generation source management information.

It should be noted that the equation above is one example only, and it is possible to opportunistically modify and amend (including coefficient multiplication techniques for equalization of units of physical quantities on both sides) by taking into consideration a case where a physical quantity other than the temperature is obtained as the operation environment value and a case where another variable factor generation source exists between the physical storage device that is registered as the m-th physical storage device management information and the variable factor generation source that is registered as the n-th variable factor generation source management information. Note however that it is desirable that any modified equation become a function of at least the above-stated distance—more preferably, let such function be a monotone decreasing function relating to the distance. After completion of the calculation, go to step S1013.

Next at step S1013, the controller 32 calculates an after-influence or "affected" operation environment value of the physical storage device that is registered as the m-th physical storage device management information. When calculating this value, there are acquired the operation environment value (see numeral 406 in FIG. 4) of the m-th physical storage device management information and the operation environment influence value (see step S1012) of the m-th physical storage device management information; then, the following equation is used:

affected operation environment value=operation environment value+operation environment influence value.

Note that the equation above is one example and may be modified and amended so that an appropriate weighting coefficient is multiplied to the operation environment influence value in accordance with peripheral operation environments of the physical storage device of interest. After the calculation, go to step S1014.

Lastly at step S1014, the controller 32 executes processing for storing the operation environment influence value. In this processing, the operation environment influence value of the physical storage device is registered to the physical storage device management information 3108 which is stored in the physical storage device management information region that is formed in the storage region of the server storage 31. After the execution, return to the step S1009.

Now, the explanation of the operation environment influence value calculation processing is ended.

Figure 11:
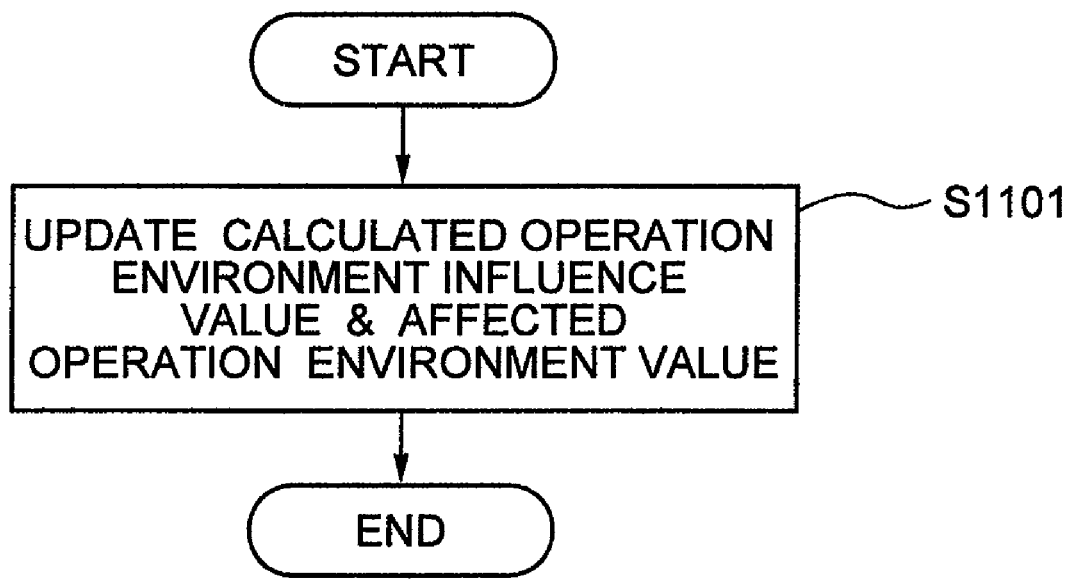
FIG. 11 is a flowchart showing a procedure for storing the operation environment value(s).

FIG. 11 is a flowchart of the operation environment influence value calculation processing. This processing is performed by the operation environment influence value storing part 3105 shown in FIG. 2. By this processing, the operation environment influence value and affected operation environment value of every physical storage device in the storage system are stored in the physical storage device management information 3108.

In step S1101, the controller 32 updates the operation environment influence value and affected operation environment value of a target physical storage device (m-th physical storage device shown in FIG. 10), which values are chosen from the physical storage device management information 3108.

Then, the operation environment influence value storing processing is ended.

A detailed explanation will next be given of processing for displaying the physical storage device management information and variable factor generation source management information at the display device 34 of the storage management server 30. To facilitate understanding of the explanation, there will first be described a display example when displaying on the screen of display 34 the physical storage device management information and variable factor generation source management information.

Figure 12:
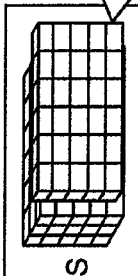
FIG. 12 is a diagram showing an exemplary on-screen display image indicative of physical storage device management information.

FIG. 12 shows an on-screen display example of the physical storage device management information. The display device 34 displays a dialog window titled "Physical Storage Device Management Information Display Screen" by the processing to be performed by the display control part 3103.

On this display screen, when selecting a physical storage device group from a pull-down menu 1201 to click on a right-side search button next thereto or selecting the physical storage device group from a tab 1202, details of the physical storage device management information of those physical storage devices included in the selected physical device group (e.g., physical storage device group-B in FIG. 12). For example, a three-dimensional (3D) graphics image 1203 which pictorially indicates that each physical device exists at which position is displayed in the form of an ensemble of blocks. Each block indicates one physical storage device (or one cooling device). In addition, an input column of a position range of physical storage devices capable of designating a target physical storage device is displayed in a pull-down menu 1204. When a physical storage device is designated from this physical storage device position range, a block which is designated in the image is displayed with visual emphasis added thereto. In the example of FIG. 12, all physical storage devices residing at those positions with Z-axis coordinate value being indicated by "i" are designated: in the above-stated image, such designated blocks are displayed so that these project toward the near side. A balloon-like popup window 1208 is added to this projected image portion, within which balloon are displayed several or all values of the physical storage device management information of the designated physical storage devices.

Note here that as shown in FIG. 13, designation of only the X-axis coordinate value results in display of a state that a vertical linear array of blocks of physical storage devices is projected toward the near side (see part (a)); designation of only the Y-axis coordinate value results in display of a state that a lateral linear array of blocks of physical storage devices is projected toward the near side (see part (b)).

When a physical storage device group is selected, a value of presently consumed energy (e.g., 280W) in its corresponding storage apparatus 20 is displayed as indicated by reference numeral 1206 in FIG. 12. By looking at this value, the administrator of the storage management server 30 is able to judge whether storage configuration relocation is to be performed or not. A method of calculating the consumed energy will be described later.

Additionally, upon selection of the physical storage device group, a maximal value of temperatures (present maximum temperature, e.g., 40.9° C.) of those physical storage devices making up the storage apparatus 20 is displayed as indicated by numeral 1207 in FIG. 12. By seeing this value, the administrator of the storage management server 30 is able to judge whether storage configuration relocation is to be performed or not in view of the fact that a physical storage device is out of the safe operation state due to its operation environment value exceeding the operation environment threshold value. For a physical storage device with its temperature exceeding the operation environment threshold value (temperature threshold in FIG. 12), a half-tone dot mesh pattern 1209 is added to its temperature value indication in the balloon 1208 for visual emphasis of the importance degree thereof to thereby provide a warning display to the administrator of the storage management server 30. Note however that once the present maximum temperature value 1207 is displayed, it is possible for the administrator to recognize the presence of such physical storage device which is out of the safe state without having to designate the physical storage device position range.

A logical storage region input box is displayed in a pull-down menu form 1205 (also called a logical storage region filter), which box is for enabling the administrator to recognize that his or her interested physical storage device belongs to which one of the logical storage regions. When designating from this logical storage region filter a logical storage region (e.g., Group-C in FIG. 12) and then clicking on an immediately adjacent search button on the right side, cells of those physical storage devices belonging to this designated logical storage region are added half-tone dot meshing 1210 in the above-stated balloon to thereby perform visually emphasized display to the administrator of the storage management server 30. By viewing this display, the administrator is able to readily affirm the physical storage devices belonging to the designated logical storage region Group-C.

Figure 14:
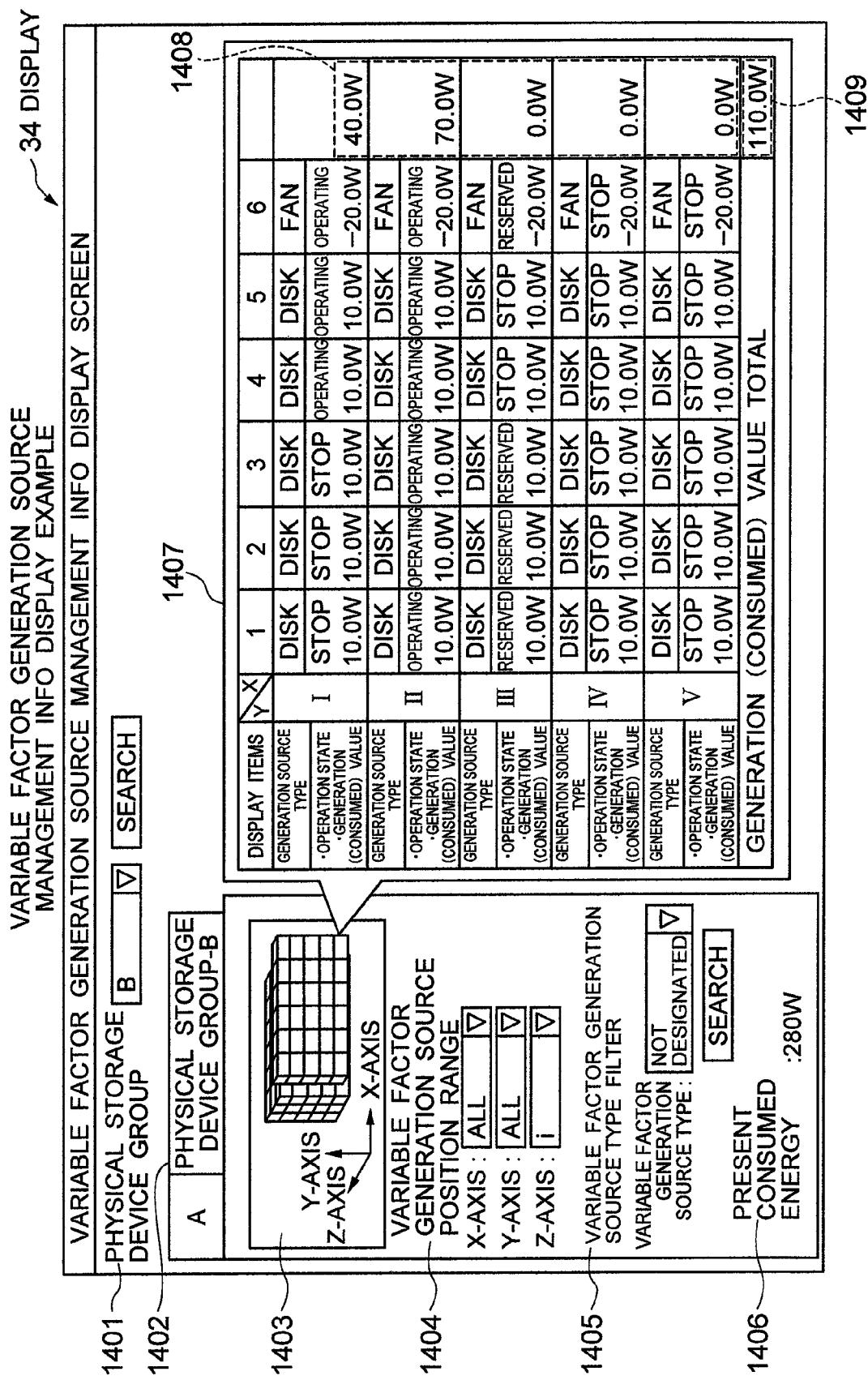
FIG. 14 is a diagram showing an exemplary on-screen display image indicative of variable factor generation source management information.

FIG. 14 shows an exemplary on-screen display image of the variable factor generation source management information. The display device 34 displays a dialog window titled the "Variable Factor Generation Source Management Information Display Screen" by means of the processing executed by the display controlling part 3103.

On this display screen, when choosing a physical storage device group from a pull-down menu 1401 to click on a right-side search button adjacent thereto or choosing the physical storage device group from a tab 1402, details of the variable factor generation source management information of one or more variable factor generation sources included in the chosen physical device group (e.g., physical storage device group-B in FIG. 14). For example, a 3D graphics image 1403 which represents that each physical device exists at which position is displayed in the form of an ensemble of blocks. Each block indicates a variable factor generation source. In addition, an input column of a position range of variable factor generation sources capable of designating a target variable factor generation source is displayed in a pull-down menu 1404. When a variable factor generation source is designated from this variable factor generation source position range, a block which is designated in the image is displayed with visual emphasis added thereto. In FIG. 14, all variable factor generation sources residing at those positions with Z-axis coordinate value being indicated by "i" are designated—in the aforesaid image, such designated blocks are displayed in such a manner as to project toward the near side. A balloon 1407 is added to this projected image, in which balloon are displayed some or all values of the variable factor generation source management information of the designated variable factor generation sources.

When a physical storage device group is selected, a value of presently consumed energy (e.g., 280W) in its corresponding storage apparatus 20 is displayed as indicated by numeral 1406 in FIG. 12. By seeing this value, the administrator of the storage management server 30 is able to judge whether storage configuration relocation is to be performed or not. This consumed energy is obtainable as a total sum of absolute values of the generation values (e.g., power consumption values in FIG. 14) of those sources with their operation states being set to the in-operation, which are extracted from all of the variable factor generation sources provided in the storage apparatus 20.

Also displayed in the balloon is a sum (e.g., 110.0W in FIG. 14) of generation (consumption) values with respect to the designated variable factor generation sources. The display processing is also arrangeable to further display a sum (e.g., 40.0 W in FIG. 14) of generation (consumption) values relative to a lateral linear array of (slot unit) of variable factor generation sources as indicated by numeral 1408.

Additionally, a generation source type input box is displayed in a pull-down menu form 1405 (called the variable factor generation source type filter), which box enables the administrator to affirm the type of a target variable factor generation source. When designating from this variable factor generation source type filter a generation source type and then clicking on an immediately adjacent search button on the right side, cells of those variable factor generation sources belonging to this designated generation source type are added half-tone dot meshing in the above-stated balloon to thereby perform visually emphasized display to the administrator of the storage management server 30. By viewing this display, the administrator is able to easily check the variable factor generation source type. Note here that in the example of FIG. 12, there is no designation of such generation source type (generation source type is set to "no designation") so that the above-stated visual emphasis is not performed.

Figure 15:
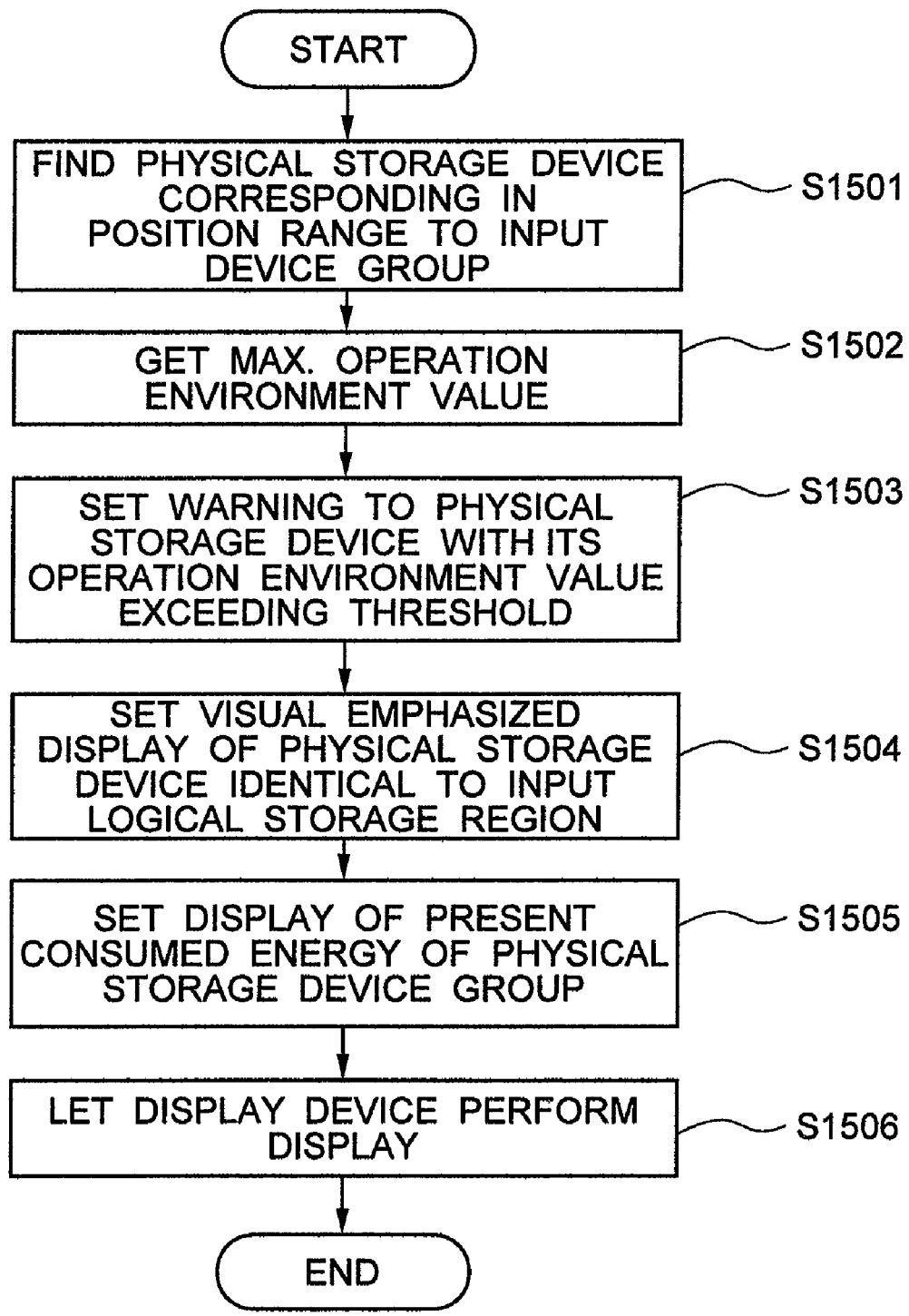
FIG. 15 is a flowchart showing a procedure for control of physical storage device management information display.

FIG. 15 is a flowchart of processing for controlling the physical storage device management information. This processing is performed by the display controlling part 3103. By this processing, the physical storage device management information is displayed in detail by the display device 34.

Firstly, at step S1501, the server 30's controller 32 conducts a search for a physical storage device(s) matching the physical storage device group as input from the input unit 33 and its position range (1204 in FIG. 12), as an example. After completion of the search, go to step S1502.

Next, at step S1502, the controller 32 acquires a maximal value of operation environment values in the input physical storage device group from the operation environment value 406 (see FIG. 4) of the physical storage device management information 3108. After the acquisition, go to step S1503.

Next at step S1503, the controller 32 sets up a warning display for a physical storage device with its operation environment value exceeding the operation environment threshold value, which device is within the searched physical storage devices. After this setup, go to step S1504.

Next at step S1504, the controller 32 sets up a visual emphasized display with respect to a physical storage device(s) identical to a logical storage region (1205 in FIG. 12) as input from the input unit 33, for example. An example in this case is that a physical storage device (record) identical to the input logical storage region is extracted from the logical storage region information 404 (see FIG. 4) of the physical storage device management information 3108, followed by execution of setup for the above-stated visual emphasized display. After the setting, go to step S1505.

Next at step S1505, the controller 32 sets up a display of present consumed energy of the input physical storage device group. In this case, the variable factor generation source management information 3109 is read out; then, a sum is calculated of absolute values of generation values of those variable factor generation sources with their operation states (504 in FIG. 5) being set to in-operation—the resultant absolute value sum is for use as a consumed energy at a present time point. After having done this setup, go to step S1506.

Finally, at step S1506, the controller 32 controls the server display monitor 34 to display the processing results. More specifically, it puts in position the physical storage devices in the input physical storage device group in accordance with the position information thereof, and then displays (1) the operation state, (2) logical storage region information, (3) operation environment value, (4) affected operation environment value and (5) operation environment threshold value of each device while at the same time displaying a maximal operation environment value (present maximum temperature) in the physical storage device group and the set-up warning display along with the on-screen visual emphasis effect(s) and the consumed energy value.

Now, the explanation of the physical storage device management information display control processing is ended.

Figure 16:
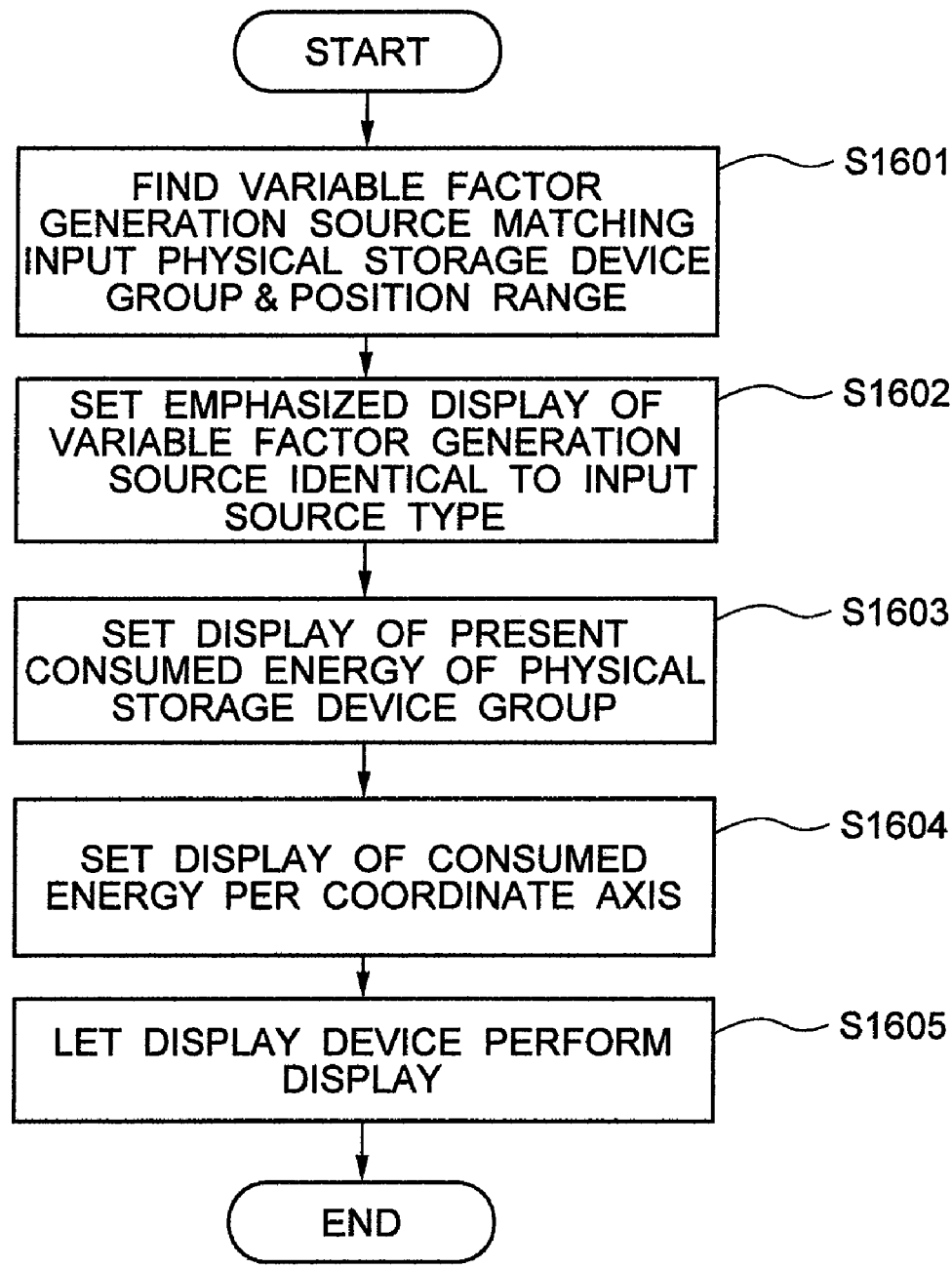
FIG. 16 is a flowchart showing a procedure for control of variable factor generation source management information display.

FIG. 16 is a flowchart of processing for display control of the variable factor generation source management information. This processing is realized by the display controlling part 3103. By this processing, the variable factor generation source management information is displayed in detail on the screen of the display device 34.

Next at step S1601, the server 30's controller 32 searches for a variable factor generation source(s) corresponding to the physical storage device group as input from the input unit 33 and its position range (1404 in FIG. 14), for example. After completion of the search, proceed to step S1602.

Next at step S1602, the controller 32 sets up on-screen visual emphasis with respect to the variable factor generation source(s) identical to the generation source type (1405) as input from the input unit 33, as an example. An example in this case is that a variable factor generation source (record) identical to the input generation source type is extracted from the generation source type 503 (see FIG. 5) of the variable factor generation source management information 3109, followed by execution of the above-stated setup for visual emphasized display. After the setting, go to step S1603.

Next at step S1603, the controller 32 sets up the display of a present consumed energy of the input physical storage device group. In this case the variable factor generation source management information 3109 is read out; then, a sum is calculated of absolute values of generation values of those variable factor generation sources each having its operation state (504 in FIG. 5) that is set to the in-operation: such the absolute value sum is for use as the present consumed energy. After having done this setup, go to step S1604.

Next at step S1604, the controller 32 performs settings for causing the display device 34 to display a present consumed energy value of the input physical storage device group on a per-coordinate axis basis. In this case, the variable factor generation source management information 3109 is read out and used to pick up variable factor generation sources of each coordinate axis (in unit of a lateral linear array of slots) and further calculate a sum of absolute values of the generation values of those variable factor generation sources with their operation states (504 in FIG. 5) being set to in-operation; then, let this absolute value sum be the present consumed energy. After having done this setup, go to step S1605.

Lastly, at step S1605, the controller provides control for causing the display monitor 34 to display processing results. Concretely, it arranges a display layout of the variable factor generation sources in the input physical storage device group in accordance with the position information thereof and then displays (1) the generation source type, (2) operation state and (3) generation value of each source while also displaying the on-screen visual emphasis effect(s) along with the value of either an entire consumed energy or a consumed energy per coordinate axis.

Now, the explanation of the variable factor generation source management information display control processing is ended.

Next, a detailed explanation will be given of the processing for monitoring the operation environment value of each physical storage device to determine whether it exceeds the operation environment threshold value and for performing data transfer, if necessary, to thereby realize the storage configuration relocation required.

Figure 17B:
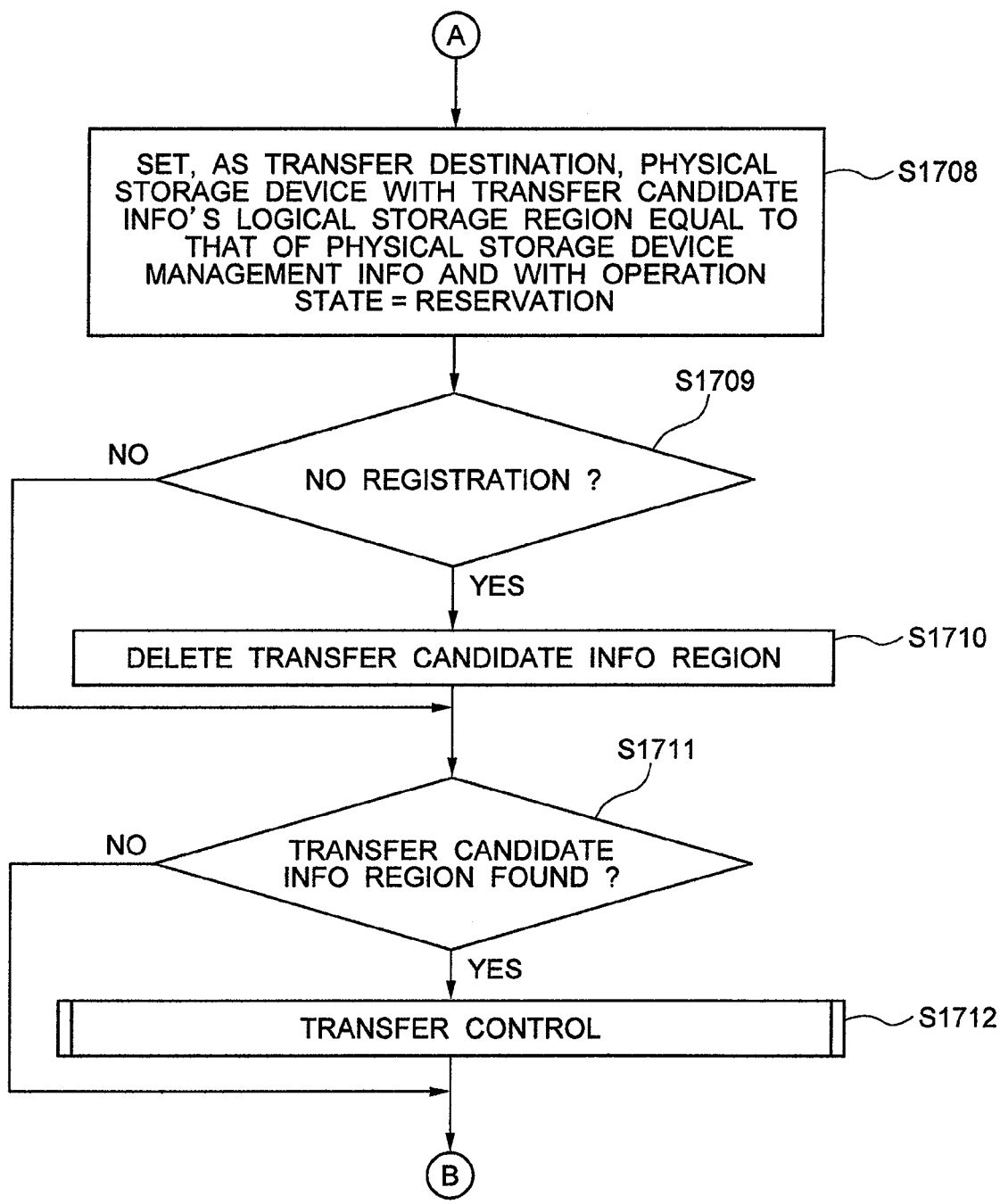

FIGS. 17A and 17B is a flow diagram of the operation environment threshold value monitoring processing. This processing is performed by the operation environment threshold value monitoring part 3106. By this processing, a physical storage device which is not safe in operation state is found while selecting a data transfer-acceptable physical storage device; then, a decision is made as to whether the data transfer is really necessary after having selected the device.

First, at step S1701, the server 30's controller 32 waits for execution of this processing within a predefined length of time period. This time period is preset from the input unit 33, for example. This waiting for such constant time is in order to achieve all-time monitoring of a change in operation environment value of each physical storage device. After the elapse of this fixed time, proceed to step S1702.

Next at step S1702, the controller 32 executes the processing for collecting physical storage device attribute information (see FIG. 6). By this processing, attribute information of each physical storage device at a present time point is collected. After having executed the processing, go to step S1703.

Next at step S1703, the controller 32 executes the processing for collecting variable factor generation source attribute information (see FIG. 8). By this processing, attribute information of each variable factor generation source at a present time point is collected. After having executed it, proceed to step S1704.

Next at step S1704, the controller 32 executes the operation environment influence value calculation processing (see FIG. 10). By this processing, an operation environment influence value and an affected operation environment value of each physical storage device at a present time point are calculated. After having executed this processing, go to step S1705.

Next at step S1705, the controller 32 provides control in order to interrupt the data transfer processing of a physical storage device with its operation state being set to reservation and with its operation environment value being less than the operation environment threshold value, wherein the control includes the process steps of changing the device's operation state to in-halt and modifying the logical storage region information to clear its value(s) and also modifying the operation state of its corresponding variable factor generation source to in-halt.

The data transfer processing-interrupted physical storage device is a device which was once determined to be a transfer candidate—this means a candidate of the data transfer source (its details will be stated later)—but is later excluded from the transfer candidate because of the fact that such necessity is gone away as its own operation environment value was lowered after elapse of a prespecified length of time.

The corresponding variable factor generation source is a variable factor generation source which has its variable factor generation source management ID (501 in FIG. 5) that is identical to the physical storage device management ID (401 in FIG. 4) of the transfer processing-interrupted physical storage device. To retain the matching between the physical storage device management information 3108 and the variable factor generation source management information 3109, the variable factor generation source also is modified. After having preformed these changes, go to step S1706.

Next at step S1706, the controller 32 forms a data transfer candidate information region in the server storage 31. This transfer candidate information region is a storage or memory region in which is stored the transfer candidate information 3110 of any physical storage device that becomes the transfer candidate. After having formed it, go to step S1707.

Here, the transfer candidate information 3110 will be described in detail.

FIG. 18 shows a data structure of the transfer candidate information. The transfer candidate information 3110 has several fields including a transfer candidate physical storage device management ID 1801, position data 1802, logical storage region information 1803, operation environment threshold value 1804, operation environment value 1805 and transfer destination physical storage device management ID 1806 and is arranged in a table form with the storage system's physical storage devices 251 being handled as records.

To the transfer candidate physical storage device management ID 1801, a value is registered, which is for recognizing and distinguishing a physical storage devices 251 that becomes the transfer candidate. This value may be the same as the value being registered to the physical storage device management ID 401; so, its explanation will be eliminated herein.

Additionally, the position data 1802, logical storage region information 1803, operation environment threshold value 1804 and operation environment value 1805 are the same in meaning as the above-stated position data 402, logical storage region information 404, operation environment threshold value 405 and operation environment value 406, respectively; so, explanations thereof are omitted here.

To the transfer destination physical storage device management ID 1806, there is registered a value for discrimination of a physical storage device which becomes the transfer destination as will be described later. In this regard, however, this value may be the same as the value to be registered to the physical storage device management ID 401 so that its explanation is omitted.

Turning back to FIG. 17A, the explanation of the operation environment threshold value monitoring processing will be continued.

At step S1707, the controller 32 registers certain physical storage devices to the move candidate information 3110 as data transfer candidates, which devices are a physical storage device with its operation environment value being greater than or equal to the operation environment threshold value and one or several physical storage devices having the same logical storage region information as that of the physical storage device.

The physical storage device with its operation environment value being larger than or equal to the operation environment threshold value is a physical storage device which is out of the safe operation state so that its data is needed to be transferred to another physical storage device. Search is conducted to find such the physical storage device from the physical storage device management information 3108, which device is determined as the transfer candidate and then registered to the transfer candidate information 3110.

The physical storage devices having the same logical storage region information as that of the physical storage device with its operation environment source being larger than or equal to the operation environment threshold value are physical storage devices which are such that the logical storage region information of the transfer candidate information 3110 is identical in value to the logical storage region information of the physical storage device management information 3108. Such physical storage devices are searched and found from the physical storage device management information 3108 and are then registered as transfer candidates to the transfer candidate information 3110. Alternatively, a technique is employable for simply determining, without regard to any present operation environment values, those physical storage devices having the same logical storage region information to be the transfer candidates in an all-at-a-time manner. After completion of the registration, go to step S1708.

Next at step S1708, the controller 32 finds from the physical storage device management information 3108 a physical storage device with the logical storage region information of the transfer candidate information 3110 being identical in value to the logical storage region information of the physical storage device management information 3108 and also with its operation state being presently set to the reservation, and then sets such the physical storage device as a transfer destination physical storage device. In this case, a value of the physical storage device management ID of this transfer destination physical storage device is registered to the column of transfer destination physical storage device management ID 1806 in the physical storage devices (records) that have been registered to the transfer candidate information 3110. By doing this, it is possible to control in such a way as to realize complexity-reduced data transfer, such as moving data to a physical storage device which is common in logical storage region and which is not rendered operative yet. After the setting of such transfer destination, go to step S1709.

Next at step S1709, the controller 32 determines whether registration of one or more physical storage devices to the transfer candidate information 3110 is absent or not. If there is no such registration (i.e., if Yes at step S1709) then go to step S1710; otherwise (No at step S1709), proceed to step S1711.

Next at step S1710, the controller 32 deletes the transfer candidate information region which was prepared in the server storage 31. After the deletion, go to step S1711.

Next at step S1711, the controller 32 determines whether another transfer candidate information region is present or not. If there is such transfer candidate information region (Yes at step S1711) then go to step S1712; otherwise (No at step S1711), return to step S1701.

Finally, at step S1712, the controller 32 executes transfer control processing. In this processing, data transfer is performed. After having executed it, return to step S1701.

Now, the explanation of the operation environment threshold value monitoring processing is ended.

Figure 19B:
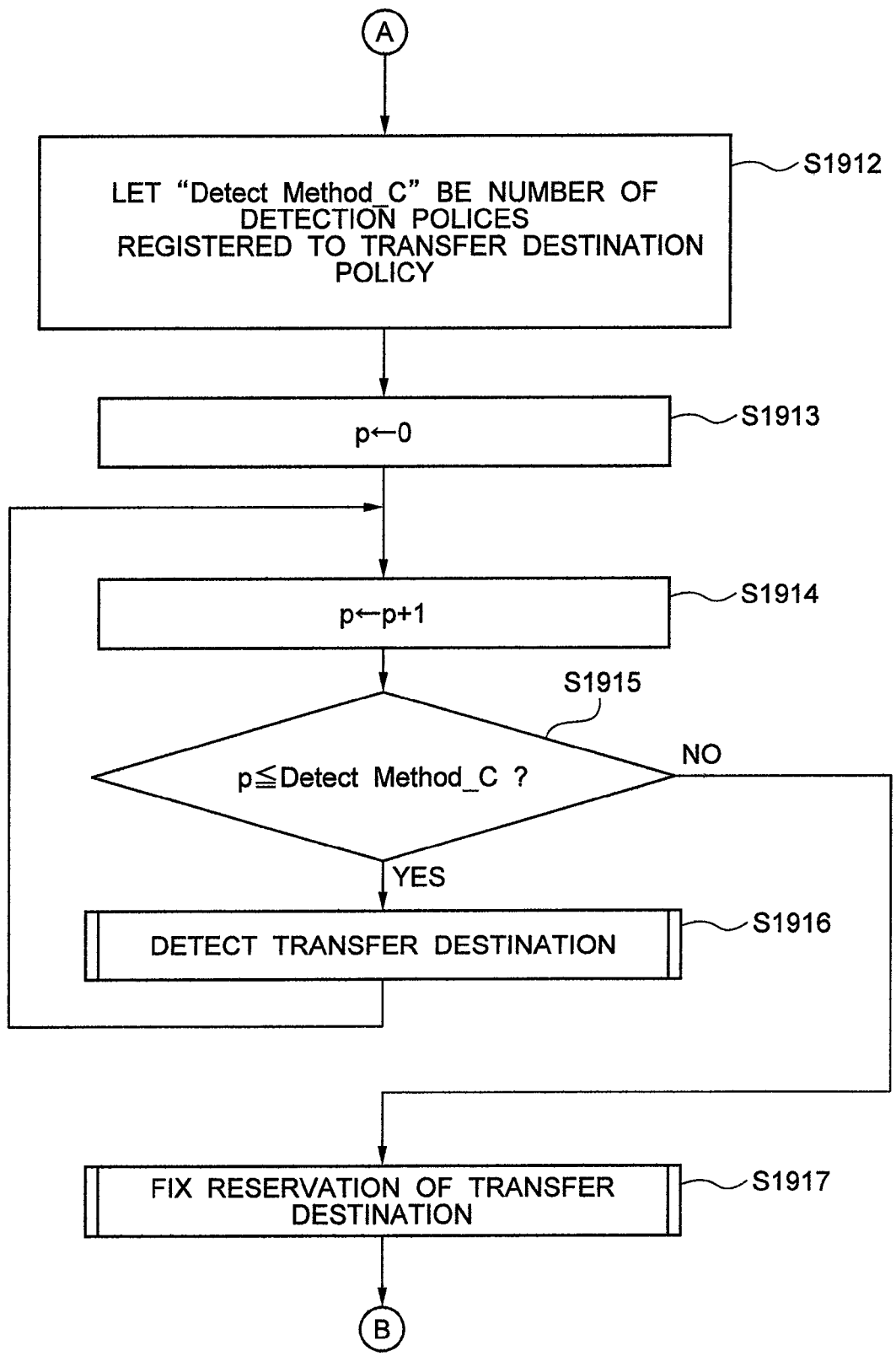

FIGS. 19A and 19B are a flowchart of the transfer control processing. This processing is realized by the transfer control part 3107 shown in FIG. 2. By this processing, data is transferred to either the already found transfer destination (see step S1708) or a destination which will be detected from now. In the case of a transfer destination being newly detected from now, search is conducted to find a transfer pattern which ensures that an after-transfer operation environment becomes optimal.

First, at step S1901, the controller 32 sorts the physical storage devices (records) that are registered to the transfer candidate information 3110 by using the logical storage region information. This is achieved by disposing the values that are registered to the logical storage region information 1803 of transfer candidate information 3110 in an ascending order (e.g., Group-A, group-B, Group-C, . . . ). Whereby, it is possible to detect an optimal data transfer destination using a transfer destination detection policy 3111 to be later described. After having sorted by the logical storage region information, proceed to step S1902.

Next at step S1902, the controller 32 puts to a variable "Move Disk_C" for substitution a number of the physical storage devices (records) that have been registered to the transfer candidate information 3110. After the substitution, go to step S1903.

Next at step S1903, the controller 32 zeros a variable n (n=0). Thereafter, go to step S1904.

Next at step S1904, the controller 32 replaces variable n with n+1 to perform variable increment. After the increment, go to step S1905.

Next at step S1905, the controller 32 judges whether the variable n is not greater than the variable "Move Disk_C." If the former is less than or equal to the latter (Yes at step S1905) then go to step S1906; otherwise (No at step S1905), exit this processing.

Next at step S1906, the controller 32 judges whether a physical storage device which becomes a transfer destination is set in n-th transfer candidate, that is, n-th physical storage device being registered to the transfer candidate information 3110. More precisely, a decision is made as to whether the physical storage device management ID for identification of physical storage device is registered to the transfer destination physical storage device management ID 1806 of transfer candidate information 3110. If such physical storage device which becomes the transfer destination is set therein (Yes at step S1906) then go to step S1907; otherwise (No at step S1906), go to step S1912.

Next at step S1907, the controller 32 executes data transfer with respect to the n-th transfer candidate, i.e., the n-th physical storage device that is registered to the transfer candidate information 3110. At this time, the data stored in the n-th physical storage device (transfer source) is copied to the physical storage device (transfer destination) which is identified by the value that is registered to the transfer destination physical storage device management ID 1806 of transfer candidate information 3110. After completion of this data copy, let the physical storage device that became the transfer destination begin to operate and, at the same time, deactivate the physical storage device that became the transfer source. After having executed the data transfer, go to step S1908.

Next at step S1908, the controller 32 modifies in a way pursuant to the data transfer the operation state and logical storage region information of the physical storage device management information 3108 relating to the physical storage device of the transfer source. More specifically, for the transfer source physical storage device, a record identical to the physical storage device management ID thereof is extracted from the physical storage device management ID 401; then, let the value of the operation state 403 be changed to the in-halt, and clear (delete) the value of logical storage region information 404. For the transfer destination physical storage device, a record identical to its physical storage device management ID is extracted from the physical storage device management ID 401; then, let the value of operation state 403 be changed to in-operation, and simultaneously, change the value of logical storage region information 404 to a value indicative of the logical storage region that was determined by this processing of the transfer control part 3107. After having changed the physical storage device management information 3108, go to step S1909.

Next at step S1909, the controller 32 executes the processing for storing the physical storage device attribute information. In this processing, the physical storage device attribute information which reflects the above-stated transfer is registered to the physical storage device management information 3108 which is stored in a physical storage device management information region that is formed in the storage region of the server storage 31. After having executed it, go to step S1910.

Next at step S1910, the controller 32 modifies the operation state of the variable factor generation source management information 3109 relating to the transfer source physical storage device in a way pursuant to the transfer stated above. More precisely, regarding the transfer source physical storage device, a record identical to the physical storage device management ID thereof is extracted from the variable factor generation source management ID 501; then, let the value of operation state 504 be changed to in-halt. For the transfer destination physical storage device, a record identical to its physical storage device management ID is extracted from the variable factor generation source management ID 501; then, the value of operation state 504 is changed to in-operation. Alternatively, the value of operation state 504 of a cooling device which cools down the transfer destination physical storage device may be set to in-operation. After having changed the variable factor generation source management information 3109, go to step S1911.

Next at step S1911, the controller 32 executes the processing for storing variable factor generation source attribute information. In this processing, the variable factor generation source attribute information which reflects the above-stated transfer is registered to the variable factor generation source management information 3109 which is stored in the variable factor generation source management information region that is formed in the storage region of the server storage 31. After having executed it, return to step S1904.

Here, the transfer destination detection policy 3111 will be described in detail. See FIG. 20, which shows a data structure of the transfer destination detection policy. The transfer destination detection policy 3111 has fields of a detection policy number 2001 and detection policy priority degree 2002 and is arranged in a table form with detection policies being as records.

To the detection policy number 2001, there are registered those values (numbers) each of which identifies a detection policy that is formed by the administrator of the storage management server 30, for example.

Registered to the detection policy priority degree 2002 are values each defining the priority of a sequence order of detecting a physical storage device 251 which becomes the transfer destination, wherein the values are sorted in the order that higher priority comes before lower priority. For example, when looking at a record with its detection policy number of "1," what is done first is to determine a transfer destination physical storage device while assigning the highest priority (detection policy priority "1") to selection in ascending order with respect to the operation environment value—in other words, the top priority is taken to a technique for choosing a physical storage device which is low in temperature. Then, in case there is no definite distinction by use of the detection policy priority "1," the second priority (detection policy priority "2") is given to selection in ascending order with respect to a (physical storage) device group to thereby determine a transfer destination physical storage device, that is, priority is now taken to a technique for choosing a physical storage device which precedes the others in label name of physical storage device group—here, in alphabetical order (A, B, ... ). Next, in case this trial using the detection policy priority "2" is ended in fail, the third priority (detection policy priority "3") is taken to ascending-order selection with respect to Z-axis coordinate values of the position information (402 in FIG. 4) to thereby try to determine a transfer destination physical storage device; in other words, priority is now taken to a technique for choosing a physical storage device which is less in Z-axis value (i, ii, ... ).

Note that the number of the detection policy priority degrees may be greater or less than three (3). Additionally, in the detection policy priority degree 2002, a detection policy priority level which is recited as "Same Priority" relative to a (physical storage) device group has the meaning that a physical storage device belonging to a physical storage device group to which the transfer destination physical storage device belongs is chosen as the transfer destination with higher priority given thereto.

Turning back to FIG. 19B, the explanation of the transfer control processing will be continued.

At step S1912, the controller 32 substitutes for a variable "Detect Method_C" a number of the detection policies (records) that are presently registered to the transfer destination detection policy 3111. After the substitution, go to step S1913.

Next at step S1913, the controller 32 zeros a variable p (p=0). Then, go to step S1914.

Next at step S1914, the controller 32 replaces the variable p with p+1 to perform variable increment. After the increment, go to step S1915.

Next at step S1915, the controller 32 judges whether the variable p is not greater than the variable "Detect Method_C." If the former is less than or equal to the latter (i.e., Yes at step S1915) then go to step S1916; otherwise (No at step S1915), proceed to step S1917.

Next at step S1916, the controller 32 executes transfer destination detection processing with respect to a p-th detection policy. After having executed it, return to step S1914.

Lastly, at step S1917, the controller 32 executes transfer destination reserving processing. After having done it, return to step S1904.

Now, the explanation of the transfer control processing is ended.

Figure 21A:
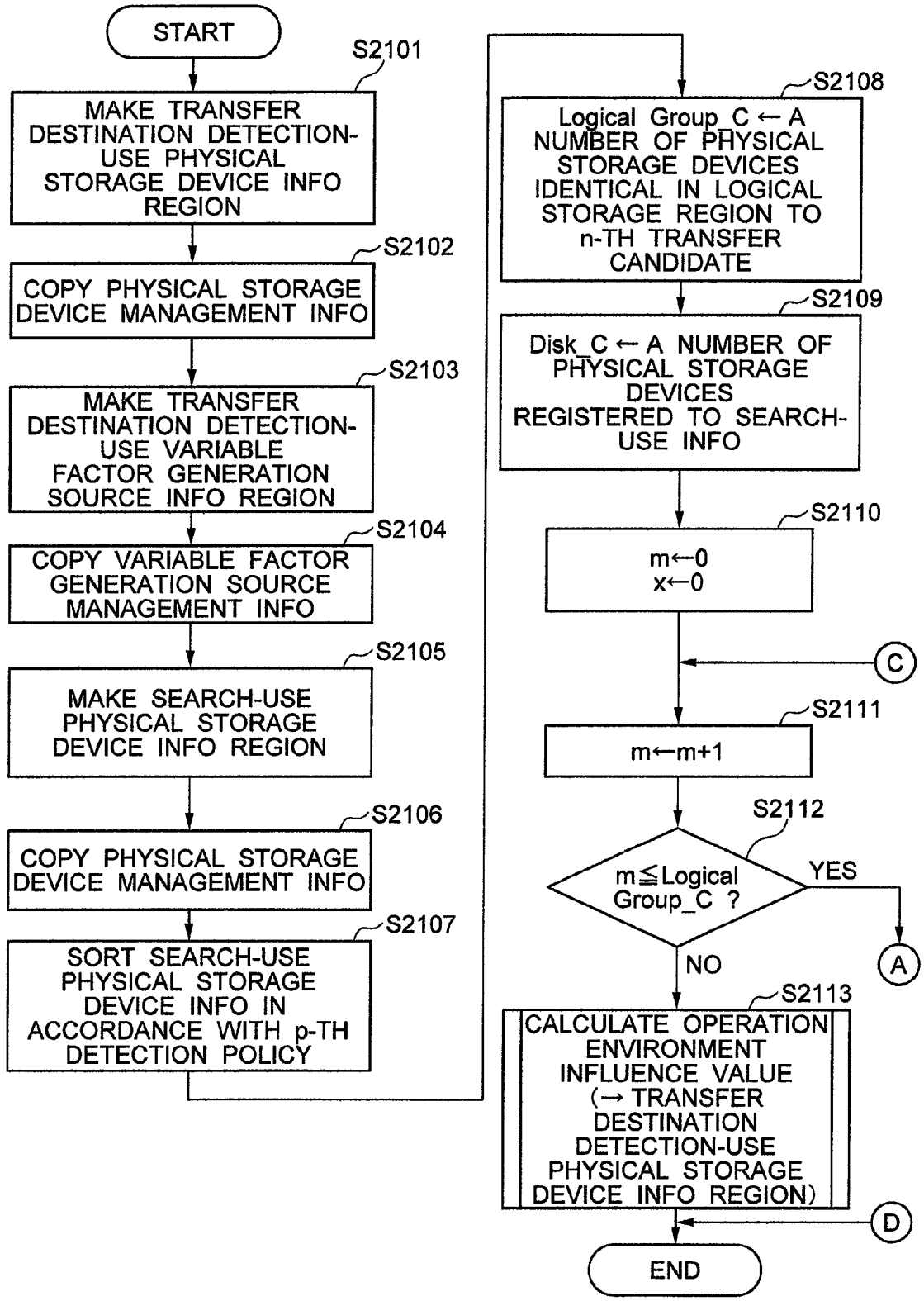

FIGS. 21A and 21B are a flowchart of the transfer destination detection processing. This processing is realized by the transfer control part 3107 shown in FIG. 2. By this processing, a transfer destination which complies with certain detection policy is detected, followed by temporary or "virtual" preparation (for the search use only) of physical storage device management information which is after having executed the intended physical storage device transfer. Then, estimation is done as to what kind of operation environment is realized with the use of such virtual physical storage device management information.

Firstly at step S2101, the controller 32 forms in the server storage 31 a transfer destination detection-use physical storage device information region. This transfer destination detection-use physical storage device information region is a storage region in which is stored the transfer destination detection-use physical storage device information 3112 of a device that was detected as a transfer destination through this processing. After having done it, proceed to step S2102.

Next at step S2102, the controller 32 copies the physical storage device management information 3108 to the transfer destination detection-use physical storage device information region thus prepared. After the copying, go to step S2103. Note here that the physical storage device management information 3108 that was copied to the transfer destination detection-use physical storage device information region becomes transfer destination detection-use physical storage device information 3112.

Next at step S2103, the controller 32 forms in the storage 31 a transfer destination detection-use variable factor generation source information region. The transfer destination detection-use variable factor generation source information region is a storage region in which is stored the transfer destination detection-use variable factor generation source information 3113 of a transfer destination as detected through this processing. After having formed it, go to step S2104.

Next at step S2104, the controller 32 copies the variable factor generation source management information 3109 to the transfer destination detection-use variable factor generation source information region thus formed. After the copying, go to step S2105. Note that the variable factor generation source management information 3109 that was copied to the transfer destination detection-use variable factor generation source information region becomes transfer destination detection-use variable factor generation source information 3113.

Next at step S2105, the controller 32 forms in storage 31 a search-use physical storage device information region. The search-use physical storage device information region is a storage region in which is stored search-use physical storage device information 3114 for use in searching for transfer destination detection through this processing. After having formed it, go to step S2106.

Next at step S2106, the controller 32 copies the physical storage device management information 3108 to the search-use physical storage device information region thus formed. After having copied it, go to step S2107. Note that the physical storage device management information 3108 that was copied to the search-use physical storage device information region becomes search-use physical storage device information 3114.

Next at step S2107, the controller 32 sorts the search-use physical storage device information in accordance with the p-th policy (see the step S1913 in FIG. 19B). After the sorting, go to step S2108.

Next at step S2108, the controller 32 substitutes for a variable "Logical Group_C" a number of those physical storage devices identical in logical storage region to the n-th transfer candidate (see the step S1906 in FIG. 19A), i.e., a number of physical storage devices having the value of logical storage region information 1803 of the n-th physical storage device that is registered to the transfer candidate information 3110. After the substitution, go to step S2109.

Next at step S2109, the controller 32 substitutes for the variable "Disk_C" a number of physical storage devices registered to the search-use physical storage device information, i.e., a number of records of the search-use physical storage device information. After the substitution, go to step S2110.

Next at step S2110, the controller 32 zeros variables m and x. After having done it, go to step S2111.

Next at step S2111, the controller 32 substitutes a value "m+1" for the variable m to perform increment of this variable. After the increment, go to step S2112.

Next at step S2112, the controller 32 judges whether the variable m is not larger than the variable "Logical Group_C." If the former is less than or equal to the latter (Yes at step S2112) then go to step S2114; otherwise (No at step S2112), go to step S2113.

Next at step S2113, the controller 32 performs operation environment influence value calculation processing. In this case, this processing is executed with respect to every search-use physical storage device information (alternatively, this may also be regarded as the transfer destination detection-use physical storage device information region because it has been stored) stored in the transfer destination detection-use physical storage device information region by execution of processing as will be described later. The calculated operation environment influence value and affected operation environment value are stored by the operation environment influence value storing part 3105 in the transfer destination detection-use physical storage device information region. After having executed this processing, quit the processing.

Next at step S2114, the controller 32 substitutes x+1 for the variable x to thereby increase its value. After this increment, go to step S2115.

Next at step S2115, the controller 32 judges whether the variable x is not larger than the variable "Disk_C." If the former is less than or equal to the latter (Yes at step S2115) then go to step S2116; otherwise (No at step S2115), go to step S2122.

Next at step S2116, the controller 32 judges whether an operation state of x-th physical storage device—i.e., an operation state (e.g., 403 in FIG. 4) of x-th physical storage device (record) of the search-use physical storage device information—is set to the in-halt or not. If it is in halt (Yes at step S2116) then go to step S2117; otherwise (No at step S2116), return to step S2114.

Next at step S2117, the controller 32 modifies to reservation the operation state of a corresponding physical storage device of the transfer destination detection-use physical storage device information 3112, i.e., a physical storage device of transfer destination detection-use physical storage device information 3112 with its ID being identical to the physical storage device management ID of the x-th physical storage device of the search-use physical storage device information and, simultaneously, updates the value of logical storage region information to a value which is the same as that of the logical storage region of a (n+m−1)-th transfer candidate. This causes the logical storage region of a physical storage device that becomes the transfer destination to become identical to the logical storage region of the transfer candidate to thereby ensure that no serious deterrent or obstruction takes place in I/O processing from external equipment. In other words, virtualization is established for allowing the data having been stored in a given logical storage region prior to data transfer to be kept stored in such the logical storage region even after the transfer when looking at from external equipment. After the modification, go to step S2118.

Next at step S2118, the controller 32 executes physical storage device attribute information storing processing. In this processing, the attribute information of the x-th physical storage device of the search-use physical storage device information that reflects the above-stated change is updated to the transfer destination detection-use physical storage device information 3112 which is stored in the transfer destination detection-use physical storage device information region that was formed in the storage region of server storage 31. After having done it, proceed to step S2119.

Next at step S2119, the controller 32 changes to reservation the operation state of a corresponding variable factor generation source of the transfer destination detection-use variable factor generation source information 3113, i.e., a variable factor generation source of the transfer destination detection-use variable factor generation source information 3113, to which is identical the physical storage device management ID of x-th physical storage device of the search-use physical storage device information. By this change, matching is taken with the move destination detection-use physical storage device information 3112. After having done the change, go to step S2120.

Next at step S2120, the controller 32 changes to reservation the operation state of a variable factor generation source which is rendered operative in a way depending on the presently intended transfer (e.g., cooling device 26 which belongs to a slot to which belongs the variable factor generation source with its operation state changed to reservation). This makes it possible to achieve assistance that becomes necessary for activation of a variable factor generation source which will possibly begin to operate due to data transfer—for example, cooling of such variable factor generation source. After having done the change, go to step S2121.

Next at step S2121, the controller 32 executes variable factor generation source attribute information storing processing. In this processing, attribute information of a variable factor generation source which corresponds to the x-th physical storage device of the search-use physical storage device information that reflects the above-stated change is updated to the transfer destination detection-use variable factor generation source information 3113 which is stored in the transfer destination detection-use variable factor generation source information region that was formed in the storage region of server storage 31. After the execution, return to step S2111.

Note that the transfer destination detection-use variable factor generation source information 3113 which was updated at this step and the transfer destination detection-use physical storage device information 3112 that was updated at the step S2118 are correlated together in a one-to-one correspondence manner by the ID that is provided in either the transfer destination detection-use variable factor generation source information 3113 or the transfer destination detection-use physical storage device information 3112, for example.

Lastly at step S2122, the controller 32 deletes the search-use physical storage device information from the server storage 31. This is done because the search-use physical storage device information 3114 has been entirely updated to the transfer destination detection-use physical storage device information 3112. After the deletion, quit this processing.

Now, the explanation of the transfer destination detection processing is ended.

FIG. 22 is a flowchart showing transfer destination reservation settlement processing. This processing is realized by the transfer control part 3107 shown in FIG. 2. By this processing, a certain one which provides the optimum operation environment, i.e., the operation environment that minimizes an energy to be consumed by an entirety of the storage system, is selected for practical use from among a large number of transfer destination-defined physical storage device management information items.

Firstly, in step S2201, the controller 32 zeros a variable "Reserve Define_No. (#)" and sets a variable "Min_Generate Value" to an infinitely large value (∞). After having done these value settings, go to step S2202.

Next at step S2202, the controller 32 puts in a variable "Reserve_C" for substitution a number of transfer destination detection-use physical storage device information regions which are formed by the above-stated transfer destination detection processing (see FIGS. 21A-21B). After the substitution, go to step S2203.

Next at step S2203, the controller 32 zeros a variable r (let r=0). Thereafter, go to step S2204.

Next at step S2204, the controller 32 replaces the variable r with r+1 to increment this variable. After the increment, go to step S2205.

Next at step S2205, the controller 32 judges whether the variable r is not larger than the variable "Reserve_C." If the former is less than or equal to the latter (Yes at step S2205) then go to step S2206; otherwise (No at step S2205), go to step S2209.

Next at step S2206, the controller 32 calculates as an r_generation value a total sum of generation values of the (virtually transfer-completed) entire storage system from r-th transfer destination detection-use variable factor generation source information 3113, that is, the transfer destination detection-use variable factor generation source information 3113 which is caused to correspond to the transfer destination detection-use physical storage device information 3112 that is stored in a transfer destination detection-use physical storage device information region relating to an input number as entered at the step S2202. More precisely, the r_generation value is a total sum of absolute values of generation values (505 in FIG. 5) of those variable factor generation sources with the operation state (504 in FIG. 5) in the transfer destination detection-use variable factor generation source information 3113 being set to either the in-operation or the reservation. After the value calculation, go to step S2207.

Next at step S2207, the controller 32 judges whether the calculated r_generation value is below a variable "Min_Generate Value." If the former is less than the latter (Yes at step S2207) then go to step S2208; otherwise (No at step S2207), return to step S2204.

Next at step S2208, the controller 32 substitutes r for the variable "Reserve Define_#" and, simultaneously, substitutes the r_generation value for the variable "Min_Generate Value." After having substituted them, go to step S2204.

It can be said that the generation value of the overall storage system is minimized through the steps S2204 to S2208, that is, a transfer destination with the optimum operation environment is finally defined or "finalized."

Next at step S2209, the controller 32 performs physical storage device attribute information storing processing. In this processing, the transfer destination detection-use physical storage device information that is stored in the transfer destination detection-use physical storage device information region indicated by the variable "Reserve Define_#" is regarded as the physical storage device management information 3108, and updating is done in the physical storage device management information region. In other words, a physical storage device which is indicated by this transfer destination detection-use physical storage device information is set up as the transfer destination with respect to the n-th transfer candidate shown in step S1906. After the execution, go to step S2210.

Next at step S2210, the controller 32 executes variable factor generation source attribute information storing processing. In this processing, the transfer destination detection-use variable factor generation source information which is stored in the transfer destination detection-use variable factor generation source information region indicated by the variable "Reserve Define_#" is regarded as the variable factor generation source management information 3109, and updating is performed in the variable factor generation source management information region. After the execution, go to step S2211.

Next at step S2211, the controller 32 executes operation environment influence value calculation processing. In this processing, an operation environment influence value and affected operation environment value are calculated based on the physical storage device management information 3108 that was updated at the step S2209 and the variable factor generation source management information 3109 that was updated at step S2210. The calculated values are set for updating to the operation environment influence value 407 and affected operation environment value 408 of the physical storage device management information 3108. After the execution, go to step S2212.

Finally, at step S2212, the controller 32 deletes from the server storage 31 every transfer destination detection-use physical storage device information (first to "Reserve_C"th) and every transfer destination detection-use variable factor generation source information (first to "Reserve_C"th). After the deletion, exit this processing.

Now, the explanation of the transfer destination reservation finalizing processing is ended.

(Epitome)

This embodiment provides technical effects and advantages which follow. One major advantage lies in an ability to achieve the intended storage configuration relocation in an operation environment dependent way since the embodiment is arranged to display the position of a target physical storage device and a warning notice of a physical storage device with its temperature increasing beyond the threshold level along with an energy consumed by the whole storage system and a present maximum temperature or else in an easily recognizable manner to thereby present the storage system's operation environment to the administrator of the storage management server for appropriate recommendation of data transfer and/ or find a transfer pattern with the optimum operation environment in the case of such data transfer being really executed.

In particular, the use of the transfer destination detection policy makes it possible to facilitate the storage management server administrator to find his or her desired transfer pattern.

In addition, by selecting as the transfer destination a physical storage device with its operation state being presently set to reservation, it is possible to alleviate time-consuming and troublesome works required for the transfer while at the same time shortening the length of a time as taken therefor (see the step S1708).

(Others)

It should be noted that although the above-stated embodiment is a currently preferred form for implementation of the present invention, its implementation form is not to be construed as limiting the invention. Consequently, this implementation form may be various modifiable and alterable without departing from the true spirit and scope of the invention.

For example, while in the above-stated embodiment the on-screen display of the physical storage device management information is performed at the storage management server 30 (see the visual emphasized pattern 1209 in FIG. 12), this may be modified so that the display, such as warning display for example, is performed at the display unit of a computer 40. When doing so, the computer 40 may be arranged to have a web browsing software program installed therein while letting the display controlling part 3103 control the computer 40 to perform the above-stated warning display.

In addition, while in this embodiment the warning display for a physical storage device with its temperature exceeding the threshold level is performed on the screen for displaying the physical storage device management information (as indicated by numeral 1209 in FIG. 12), this warning display may alternatively be done by notification using electronic mails. More specifically, an email-editable software program is installed in any one of the storage management server 30 and computer 40 for providing control to execute the software-based processing in a way responding to occurrence of an event that the operation environment value (operation temperature) collected by the attribute information collecting part 3101 is in excess of the operation environment threshold value (temperature threshold).

Additionally in the embodiment stated supra, the warning display is performed in the process of displaying a present operation temperature (see the visual emphasized pattern 1209 of FIG. 12). However, this warning display may alternatively be performed with respect to the affected temperature (affected operation environment value) in the case of the data transfer being performed through this processing (say, after-transfer warning display). More specifically, the display control part 3103 performs the warning display (its display form is modifiable on a case-by-case basis) with respect to a physical storage device with its affected temperature exceeding the temperature threshold value. In this case an arrangement is employable for making reference to the variable factor generation source management information 3109 to thereby obtain an entire consumed energy amount in storage apparatus 20 after transfer (i.e., total after-transfer energy consumption) and then additionally display this value at a portion near the indication of "Present Consumed Energy" 1206, for example. Regarding the indication "Present Max. Temperature" 1207, an after-transfer maximum temperature (i.e., the maximum value of affected temperatures of respective physical storage devices after data transfer) may be displayed. With these arrangements, it is possible to judge in advance whether the storage configuration relocation by means of finally defined data transfer is adequate or not.

Additionally in the embodiment, the on-screen display of the physical storage device management information is performed in a way enabling visual recognition of the positional relationship of respective physical storage devices in the 3D-like graphics image form 1203 in FIG. 12. However, this embodiment may be modified to display a distribution of temperatures at respective parts in storage apparatus 20 by using the above-stated positional relationship. More precisely, a correspondence relation between physical storage device temperature ranges and temperature-indicating display colors is prestored, with the display control part 3103 being arranged to display a block of physical storage devices while adding thereto its corresponding color in the on-screen display image 1203 of FIG. 12. An example is that a physical storage device of relatively high temperature is visualized by using a red block whereas the other physical storage devices are displayed by blue blocks. This color-distinguished display may be performed not only at a present time, i.e., prior to data transfer, but also after completion of the data transfer.

Additionally in the embodiment, the on-screen display of variable factor generation source management information is arranged to display a total of generation (consumption) values with respect to a lateral linear array of variable factor generation sources (with a slot as the unit), and the processing therefor is performed (see the cell block 1408 in FIG. 14 and step S1604 of FIG. 16). But, this display and the processing may be eliminated when the need arises.

Additionally in the embodiment, a data transfer destination is determined under an assumption that minimization of storage apparatus's total consumed energy leads to establishment of the optimum operation environment (see step S2208 in FIG. 22). However, the data transfer destination may alternatively be determined while defining the optimum operation environment to be an environment with the temperature (affected operation environment value) of each physical storage device being kept not to exceed the operation environment threshold value. More specifically, in the transfer destination reservation finalization processing (FIG. 22), control is provided to select from among a plurality of items of transfer destination detection-use physical storage device information 3112 a physical storage device with its affected operation environment value being kept lower than the operation environment threshold value.

Additionally in the embodiment, when performing the storage configuration relocation, control may be provided so that a single logical storage region is configured from a physical storage device equipped in a storage apparatus and a physical storage device built in another storage apparatus.

Miscellaneously, regarding practically implemented parts or components, such as the hardware, software, each table and each flowchart, these are modifiable on a case-by-case basis without departing from the spirit and scope of the invention as defined in the appended claims.

The invention claimed is:

1. A storage management server coupled to a storage apparatus having physical storage devices and dependent operational devices rendered operative depending on activation of said physical storage devices, comprising:

a storage unit storing an operation environment threshold value;

a control device; and a display device, wherein said control device controls to collect operation environment value of physical storage devices provided in said storage apparatus from said storage apparatus, and determines whether said operation environment value collected exceeds said operation environment threshold value, wherein said control device controls to collect energy consumption amounts of physical storage devices and dependent operational devices from said storage apparatus, calculates a total energy consumption amount in said storage apparatus according to the collected energy consumption amounts of said physical storage devices and said dependent operational devices, and wherein, when a result of the determination indicates that there is a certain physical storage device with its collected operation environment value exceeding said operation environment threshold value, said display device displays warning information indicating operation environment value being exceeded said operation environment threshold value, and displays said total energy consumption amount in said storage apparatus.

2. A storage management server according to claim 1,
wherein said display device displays a maximal value of said operation environment values stored in the storage unit.

3. A storage management server according to claim 2, further comprising:
a input device receiving a position range,
wherein said controller identifies at least one of said physical storage device or at least on of said dependent operational device belonging to said position range, and
wherein said display device displays with visual emphasis an image indicating said at least one of said physical storage devices or said at least one of said dependent operational devices.

4. The storage management server according to claim 2, further comprising:
a input device receiving a request designating a certain logical storage region, which is one of logical storage regions provided by said storage apparatus with said physical storage devices, wherein said storage unit stores a correspondence between said logical storage regions and said physical storage devices,
wherein said controller identifies a part of said physical storage devices corresponding to said certain logical storage region, and
wherein said display device displays with visual emphasis an image indicating said part of said physical storage devices.

5. A storage management server according to claim 4,
wherein the storage unit stores positions of said physical storage device, operation environment influence value which indicates an influence of an operation environment when a first logical storage region which is one of said logical storage regions is transferred from a first physical storage device which is one of said physical storage devices to a second physical storage device which is another one of said physical storage device,
wherein said controller calculates an affected operation environment value, based on said positions of said physical storage device, said operation environment value, and said operation environment influence value,
wherein said controller calculates an total after-transfer energy consumption amount, based on said transfer of said first logical storage region, said energy consumption amounts,
wherein said display device displays warning information indicating which an operation environment value exceeds said operation environment threshold value after said transferring of said first logical storage region is executed, when said affected operation environment value exceeds said operation environment threshold value, and
wherein said display device displays said position of said physical storage devices and said total after-transfer energy consumption amount in said storage apparatus.

* * * * *